(12) United States Patent
Lue

(10) Patent No.: US 9,224,474 B2
(45) Date of Patent: Dec. 29, 2015

(54) P-CHANNEL 3D MEMORY ARRAY AND METHODS TO PROGRAM AND ERASE THE SAME AT BIT LEVEL AND BLOCK LEVEL UTILIZING BAND-TO-BAND AND FOWLER-NORDHEIM TUNNELING PRINCIPALS

(71) Applicant: Macronix International Co., Ltd., Hsinchu (TW)

(72) Inventor: Hang-Ting Lue, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 166 days.

(21) Appl. No.: 14/019,183

(22) Filed: Sep. 5, 2013

(65) Prior Publication Data

US 2014/0192594 A1 Jul. 10, 2014

Related U.S. Application Data

(60) Provisional application No. 61/750,380, filed on Jan. 9, 2013, provisional application No. 61/833,402, filed on Jun. 10, 2013.

(51) Int. Cl.
*G11C 16/04* (2006.01)
*G11C 16/10* (2006.01)
(Continued)

(52) U.S. Cl.
CPC ........ *G11C 16/0475* (2013.01); *G11C 16/0466* (2013.01); *G11C 16/0483* (2013.01); *G11C 16/10* (2013.01); *G11C 16/3427* (2013.01);
(Continued)

(58) Field of Classification Search
CPC ............... G11C 16/10; G11C 16/0475; G11C 16/0466; G11C 16/3427; G11C 16/0483; G11C 2213/71; H01L 27/1157; H01L 27/11578
See application file for complete search history.

(56) References Cited

U.S. PATENT DOCUMENTS 4,881,114 A 11/1989 Mohsen et al.
5,374,564 A 12/1994 Bruel
(Continued)

FOREIGN PATENT DOCUMENTS

CN 1759482 A 4/2006
EP 1936681 A1 6/2008
EP 2048709 A2 4/2009

OTHER PUBLICATIONS

Choi et al., "Performance Breakthrough in NOR Flash Memory With Dopant-Segregated Schottky-Barrier (DSSB) SONOS Devices," Jun. 2009 Symposium on VLSI Technology Digest of Technical Papers, pp. 222-223.
(Continued)

*Primary Examiner* — Richard Elms
*Assistant Examiner* — Ajay Ojha
(74) *Attorney, Agent, or Firm* — Haynes Beffel & Wolfeld LLP

(57) ABSTRACT

A p-channel flash memory device including a 3D NAND array has excellent performance characteristics. Techniques for operating 3D, p-channel NAND arrays include selective programming, selective (bit) erase, and block erase. Selective programming bias arrangements induce band-to-band tunneling current hot electron injection to increase threshold voltages in selected cells. Selective erase biasing arrangements induce –FN hole tunneling to decrease threshold voltages in selected cells. Also, block erase bias arrangements induce –FN hole tunneling in selected blocks of cells.

21 Claims, 21 Drawing Sheets

(51) Int. Cl.
*G11C 16/34* (2006.01)
*H01L 27/115* (2006.01)

(52) U.S. Cl.
CPC ...... *H01L 27/1157* (2013.01); *H01L 27/11578* (2013.01); *G11C 2213/71* (2013.01)

(56) References Cited

U.S. PATENT DOCUMENTS

| | | | |
|---|---|---|---|
| 5,909,392 A * | 6/1999 | Chang et al. | 365/185.12 |
| 5,912,489 A | 6/1999 | Chen et al. | |
| 5,991,193 A | 11/1999 | Gallagher et al. | |
| 5,993,667 A | 11/1999 | Overman | |
| 6,034,882 A | 3/2000 | Johnson et al. | |
| 6,906,361 B2 | 6/2005 | Zhang | |
| 6,906,940 B1 | 6/2005 | Lue | |
| 7,005,350 B2 | 2/2006 | Walker et al. | |
| 7,081,377 B2 | 7/2006 | Cleeves | |
| 7,129,538 B2 | 10/2006 | Lee et al. | |
| 7,177,169 B2 | 2/2007 | Scheuerlein | |
| 7,227,783 B2 | 6/2007 | Li | |
| 7,274,594 B2 | 9/2007 | Pascucci et al. | |
| 7,315,474 B2 | 1/2008 | Lue | |
| 7,382,647 B1 | 6/2008 | Gopalakrishnan | |
| 7,420,242 B2 | 9/2008 | Lung | |
| 7,433,235 B2 | 10/2008 | Chae et al. | |
| 7,453,729 B2 | 11/2008 | Lee | |
| 7,473,589 B2 | 1/2009 | Lai et al. | |
| 7,709,334 B2 | 5/2010 | Lai et al. | |
| 7,851,849 B2 | 12/2010 | Kiyotoshi | |
| 8,208,279 B2 | 6/2012 | Lue | |
| 8,503,213 B2 | 8/2013 | Chen et al. | |
| 8,531,886 B2 | 9/2013 | Huang et al. | |
| 8,659,944 B2 | 2/2014 | Hung et al. | |
| 8,724,390 B2 | 5/2014 | Hung et al. | |
| 2002/0028541 A1* | 3/2002 | Lee et al. | 438/149 |
| 2004/0124466 A1 | 7/2004 | Walker et al. | |
| 2005/0127428 A1* | 6/2005 | Mokhlesi et al. | 257/315 |
| 2005/0280061 A1 | 12/2005 | Lee | |
| 2006/0281260 A1* | 12/2006 | Lue | 438/264 |
| 2007/0140001 A1 | 6/2007 | Motoi et al. | |
| 2007/0253233 A1 | 11/2007 | Mueller et al. | |
| 2008/0048237 A1 | 2/2008 | Iwata | |
| 2008/0073635 A1 | 3/2008 | Kiyotoshi et al. | |
| 2008/0096327 A1 | 4/2008 | Lee et al. | |
| 2008/0101109 A1 | 5/2008 | Haring-Bolivar et al. | |
| 2008/0106931 A1 | 5/2008 | Toda | |
| 2008/0170429 A1 | 7/2008 | Bertin et al. | |
| 2008/0180994 A1 | 7/2008 | Katsumata et al. | |
| 2008/0247230 A1 | 10/2008 | Lee et al. | |
| 2008/0285350 A1 | 11/2008 | Yeh | |
| 2009/0097321 A1 | 4/2009 | Kim et al. | |
| 2009/0141555 A1* | 6/2009 | Lue | 365/185.17 |
| 2009/0184360 A1 | 7/2009 | Jin et al. | |
| 2010/0120226 A1 | 5/2010 | Yamazaki et al. | |
| 2010/0226195 A1 | 9/2010 | Lue | |
| 2010/0270593 A1 | 10/2010 | Lung et al. | |
| 2011/0044112 A1* | 2/2011 | Torii | 365/185.18 |
| 2011/0069524 A1 | 3/2011 | Toba et al. | |
| 2011/0286283 A1 | 11/2011 | Lung et al. | |
| 2011/0292738 A1 | 12/2011 | Hsu et al. | |
| 2011/0305088 A1 | 12/2011 | Huang et al. | |
| 2012/0007167 A1 | 1/2012 | Hung et al. | |
| 2012/0051137 A1 | 3/2012 | Hung et al. | |
| 2012/0068241 A1 | 3/2012 | Sakuma et al. | |
| 2012/0081962 A1 | 4/2012 | Tsai et al. | |
| 2012/0182802 A1 | 7/2012 | Hung et al. | |
| 2012/0182804 A1 | 7/2012 | Hung et al. | |
| 2012/0182806 A1 | 7/2012 | Chen et al. | |
| 2012/0182808 A1 | 7/2012 | Lue et al. | |
| 2012/0281471 A1 | 11/2012 | Hung et al. | |
| 2012/0327714 A1 | 12/2012 | Lue | |
| 2013/0088920 A1 | 4/2013 | Huang et al. | |
| 2013/0279251 A1* | 10/2013 | Lee | 365/185.03 |
| 2014/0301146 A1* | 10/2014 | Kaza et al. | 365/185.23 |

OTHER PUBLICATIONS

Fukuzumi et al. "Optimal Integration and Characteristics of Vertical Array Devices for Ultra-High Density, Bit-Cost Scalable Flash Memory," IEEE Dec. 2007, pp. 449-452.

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Johnson M. et al., "512-Mb PROM With a Three-Dimensional Array of Diode/Antifuse Memory Cells," IEEE Journ. Solid-State Circuits 83(11), Nov. 2003, pp. 1920-1928.

Jung et al., "Three Dimensionally Stacked NAND Flash Memory Technology Using Stacking Single Crystal Si Layers on ILD and TANOS Sructure for Beyond 30nm Node," IEEE IEDM, Dec. 11-13, 2006, 4 pages.

Katsumata et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

Lai et al., "A Multi-Layer Stackable Thin-Film Transistor (TFT) Nand-Type Flash Memory", IEEE Int'l Electron Devices Meeting, Dec. 11-13, 2006.

Lai et al., "Highly Reliable MA BE-SONOS (Metal-Al2 O3 Bandgap Engineered SONOS) Using a SiO2 Buffer Layer," VLSI Technology, Systems and Applications, 2008, VLSI-TSA 2008 International Symposium on Apr. 21-23, 2008, pp. 58-59.

Lue et al., "A Novel Buried-Channel FinFET BE-SONOS NAND Flash With Improved Memory Window and Cycling Endurance," 2009 Symposium on VLSI Technology Digest of Technical Papers, Jun. 16-18, 2009, pp. 224-225.

Lue, Hang-Ting et al. "A novel bit alterable 3D NAND flash using junction-free p-channel device with band-to-band tunneling induced hot-electron programming," 2013 Symp. on VLSI Technology (VLSIT), Jun. 11-13, 2013, pp. T152, T153.

Paul et al., "Impact of a Process Variation on Nanowire and Nanotube Device Performance," IEEE Trans. on Electron Devices, vol. 54, No. 9, Sep. 2007, pp. 2369-2376.

Tanaka et al., "Bit Cost Scalable Technology with Punch and Plug Process for Ultra High Density Flash Memory," VLSI Technology, 2007 IEEE Symposium on Jun. 12-14, 2007, pp. 14-15.

U.S. Appl. No. 13/772,058 entitled 3D NAND Flash Memory filed Feb. 20, 2013, 70 pages.

U.S. Appl. No. 13/827,475, filed Mar. 14, 2013 Hung, Shuo-Nan et al., "Programmng Technique for Reducing Program Disturb in Stacked Memory Structures," 47 pp.

Wang, Hsin-Heng et al., "A New Read-Disturb Failure Mechanism Caused by Boosting Hot-Carrier Injection Effect in MLC NAND Flash Memory," IEEE International Memory Workshop, 2009. IMW '09. May 10-14, 2009, 2 pages.

* cited by examiner

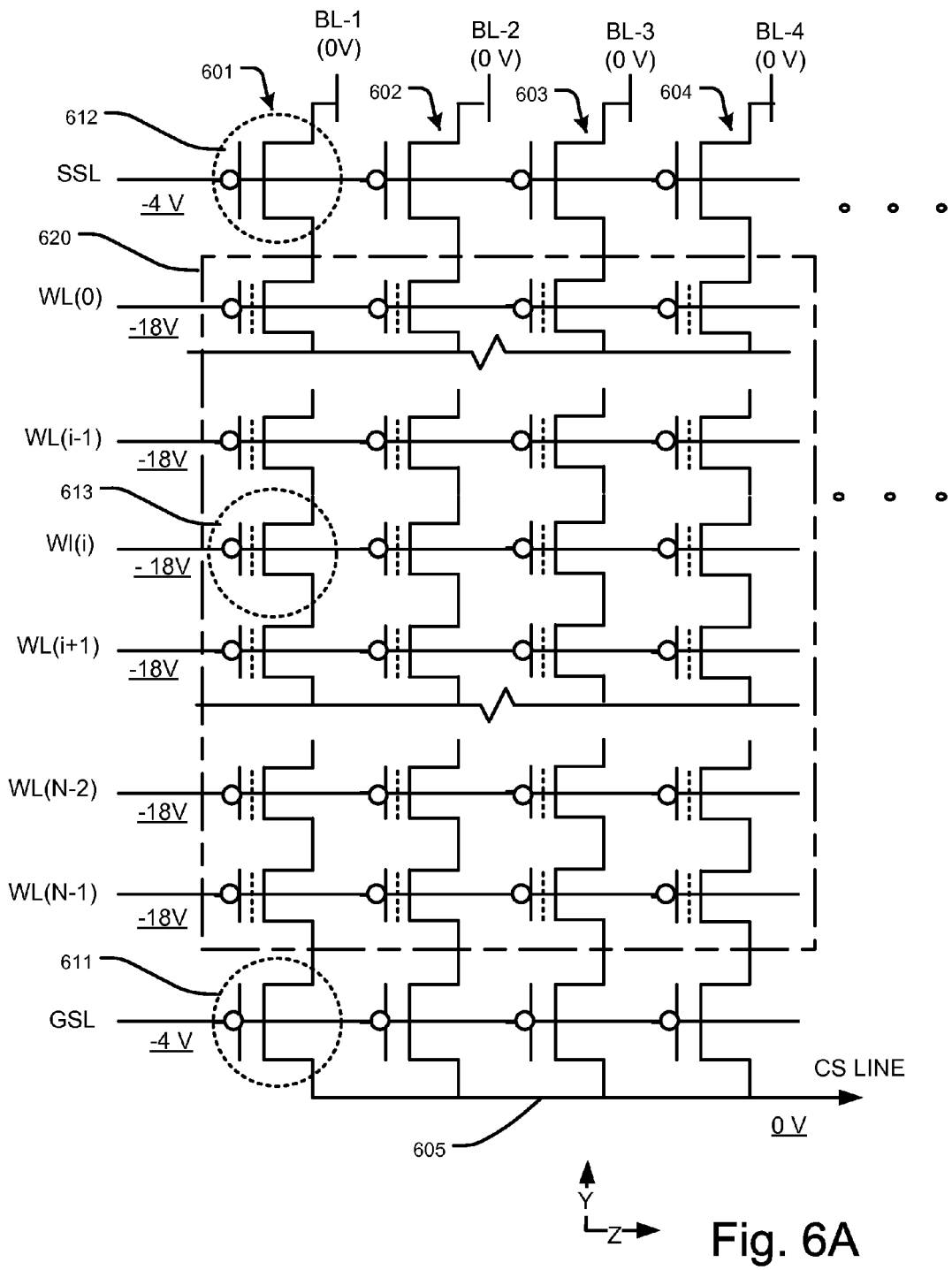

US 9,224,474 B2

P-CHANNEL 3D MEMORY ARRAY AND METHODS TO PROGRAM AND ERASE THE SAME AT BIT LEVEL AND BLOCK LEVEL UTILIZING BAND-TO-BAND AND FOWLER-NORDHEIM TUNNELING PRINCIPALS

CROSS-REFERENCE TO RELATED APPLICATIONS

The benefit is claimed of U.S. Provisional Application No. 61/750,380 entitled "Operation Methods for P-Channel 3D NAND Flash" filed 9 Jan. 2013, and U.S. Provisional Application No. 61/833,402 entitled "P-Channel 3D Memory Array" filed 10 Jun. 2013, both of which are incorporated by reference as if fully set forth herein.

BACKGROUND

1. Field

The present technology relates to high density memory devices, such as memory devices in which multiple levels of memory cells are arranged to provide a three-dimensional 3D array.

2. Description of Related Art

In one trend to achieve high density memory, designers have been looking to techniques for stacking multiple levels of memory cells to achieve greater storage capacity, and to achieve lower costs per bit. For example, thin film transistor techniques are applied to charge trapping memory technologies in Lai, et al., "A Multi-Layer Stackable Thin-Film Transistor (TFT) NAND-Type Flash Memory," IEEE Int'l Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30 nm Node," IEEE Int'l Electron Devices Meeting, 11-13 Dec. 2006.

More recently, advanced 3D technologies developed have been described in U.S. Patent Application Publication No. US 2012/0007167, published 12 Jan. 2012, and filed 31 Jan. 2011, entitled 3D MEMORY ARRAY WITH IMPROVED SSL AND BL CONTACT LAYOUT, in U.S. Patent Application Publication No. US 2012/0007167, published 12 Jan. 2012, and filed 31 Jan. 2011, entitled ARCHITECTURE FOR A 3D MEMORY ARRAY, and in U.S. patent application Ser. No. 13/772,058, filed 20 Feb. 2013, entitled 3D NAND FLASH MEMORY.

It is desirable to provide technologies can improve program and erase performance in high density memory.

SUMMARY

Techniques are described herein for operating a p-channel flash memory device suitable for 3D arrays. Included are techniques for programming, selective (bit) erase, and block erase that can be used in high density 3D array structures. Selective programming bias arrangements are described that induce band-to-band tunneling current hot electron injection to increase threshold voltages in selected cells. Selective erase biasing arrangements are described that induce −FN hole tunneling to decrease threshold voltages in selected cells. Also, block erase biasing arrangements are described that induce −FN hole tunneling in selected blocks of cells.

P-channel, 3D array structures are described to which the operating methods are applied.

BRIEF DESCRIPTION OF THE DRAWINGS

FIG. 6A is a schematic diagram of a slice of a p-channel 3D NAND structure showing a bias arrangement for block erase.

DETAILED DESCRIPTION

Figure 1:
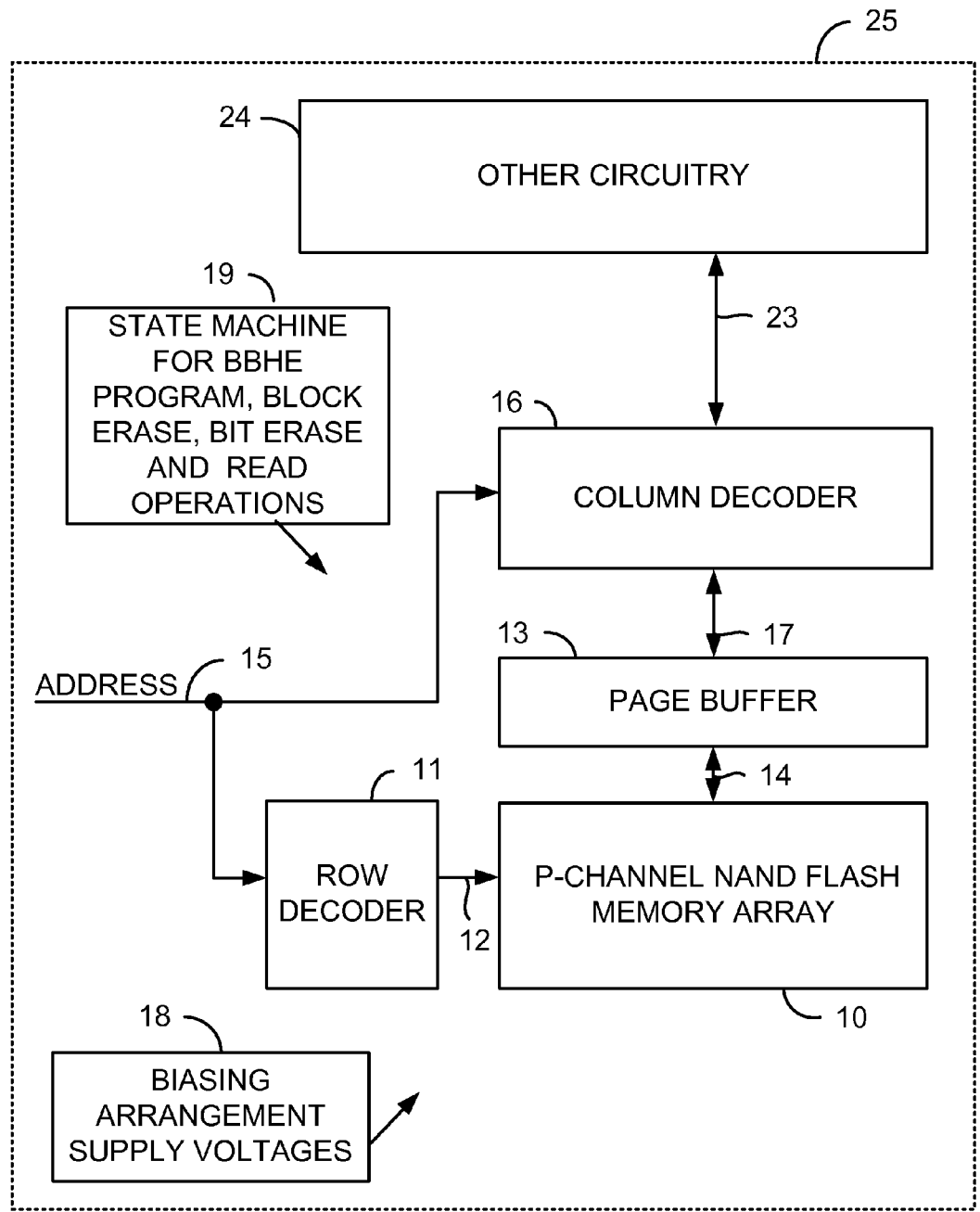
FIG. 1 is a simplified block diagram of an integrated circuit including a p-channel NAND flash memory array which can be operated as described herein.

A detailed description of embodiments of the present invention is provided with reference to FIGS. 1-19.

Most of the 3D NAND Flash technology described in the literature utilizes n-channel devices. Due to the floating body nature (no body contact) of some 3D NAND architectures, −FN block erase is accomplished in n-channel devices utilizing a so called gate induced drain leakage induced "GIDL-induced" current for erase, where the SSL lines and GSL lines must be applied a moderate negative voltage, while bit lines (BL) and the common source line (CSL) are applied a high positive voltage to generate GIDL current at the SSL/GSL junction edge. Electron and hole pairs are generated by GIDL, where holes are swept into the NAND string. The accumulation of holes at the channel then raise up the channel potential, leading to the subsequent −FN hole tunneling injection at the devices.

Such GIDL-induced erase has many drawbacks. First, the erase transient often has some time lag due to the long minority carrier (hole) generation time, and the erase speed is sensitively dependent on the GIDL current and SSL/GSL junction profile. To enhance GIDL current the SSL/GSL devices are applied larger negative voltage, but larger negative voltages can cause disturbance of data in other blocks during block erase.

A general issue of 3D NAND is that the block size is often very large while erase only allows a full block erase. This is not convenient if a user wants only to change the code of a small unit.

3D NAND often has large word line resistance/capacitance RC delay, and thus it generally requires more partitions of the memory array on the chip. As a result, the CMOS word line driver area can consume a very significant part of the die size. However, the CMOS design rule (size) must be relatively large because of the large +FN programming bias required (>20V typically).

A p-channel NAND as described herein uses a lower voltage hot electron programming method, enabling for some implementations smaller CMOS design rules for peripheral circuits. Furthermore, the p-channel NAND as described herein avoids the trouble of GIDL-induced erase because channel hole current is readily induced without GIDL. Also bit alterable erase is described which enables very simple "overwrite" of any small unit without block erase, just like a hard disk drive.

It is found that the p-channel thin film transistor TFT NAND device also can be implemented with excellent drain current to gate voltage (IdVg) curves in a p-channel NAND configuration.

Also, array drain current saturation current Idsat can be well above 100 nA for a 64-WL 3D TFT NAND, and subthreshold slope values can be below 400 mV/decade, establishing good performance characteristics.

These results suggest that hole mobility is comparable to electron mobility in n-channel NAND in the polysilicon thin film transistor device, which may partially explain the surprising performance of the p-channel 3D NAND configured for operation as described herein.

FIG. 1 is a simplified block diagram of an integrated circuit 175 including a p-channel, NAND flash memory array 10 which can be operated as described herein. In some embodiments, the array 10 is a 3D memory and includes multiple levels of cells. A row decoder 11 is coupled to a plurality of word lines 12 arranged along rows in the memory array 10. Column decoders in block 16 are coupled to a set of page buffers 13, in this example via data bus 17. The global bit lines 14 are coupled to local bit lines (not shown) arranged along columns in the memory array 10. Addresses are supplied on bus 15 to column decoder (block 16) and row decoder (block 11). Data is supplied via the data-in line 23 from other circuitry 24 (including for example input/output ports) on the integrated circuit, such as a general purpose processor or special purpose application circuitry, or a combination of modules providing system-on-a-chip functionality supported by the array 10. Data is supplied via the data-in line 23 to input/output ports or to other data destinations internal or external to the integrated circuit 25.

A controller, implemented in this example as a state machine 19, provides signals to control the application of bias arrangement supply voltages generated or provided through the voltage supply or supplies in block 18 to carry out the various operations described herein, including operations to read and write data in the array. These operations include erase, program and read. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

For clarity purposes, the term "program" as used herein refers to an operation which increases the threshold voltage of a memory cell. The data stored in a programmed memory cell can be represented as a logical "0" or logical "1." The term "erase" as used herein refers to an operation which decreases the threshold voltage of a memory cell. The data stored in an erased memory cell can be represented as the inverse of the programmed state, as a logical "1" or a logical "0." Also, multibit cells can be programmed to a variety of threshold levels, and erased to a single lowest threshold level or highest threshold level, as suits a designer. Further, the term "write" as used herein describes an operation which changes the threshold voltage of a memory cell, and is intended to encompass both program and erase, or a combination of program and erase operations.

A program operation described herein includes biasing selected memory cells for band-to-band tunneling hot electron programming, to inject electrons into the charge storage structure of a selected memory cell, thereby increasing the threshold voltage. A program operation can be applied to program one or more selected memory cells in a page, in a word or in a byte for example. During the program operation, unselected memory cells are biased to prevent or reduce disturbance of stored charge.

A selective erase, also called "bit erase," operation described herein includes biasing a selected memory cell within a block of cells for negative Fowler-Nordheim (−FN) tunneling to inject holes into the charge storage structure of a selected memory cell, thereby reducing the threshold voltage. The "bit erase" can be applied to erase a single cell in a selected NAND string in a NAND array. A "bit erase" operation can be applied to erase one or more selected memory cells in a page, in a word or in a byte for example. During "bit erase" unselected memory cells in the block including the selected NAND string are biased to prevent or reduce disturbance of stored charge.

A block erase operation described herein includes biasing a block of cells for negative Fowler-Nordheim (−FN) tunneling to inject holes into the charge storage structures of cells in the selected block, thereby reducing the threshold voltages, at least in cells of the block that do not already have a low threshold voltage.

Using a combination of the program and bit erase operations, random access write operations can be performed without requiring the overhead associated with block erase.

Figure 2:
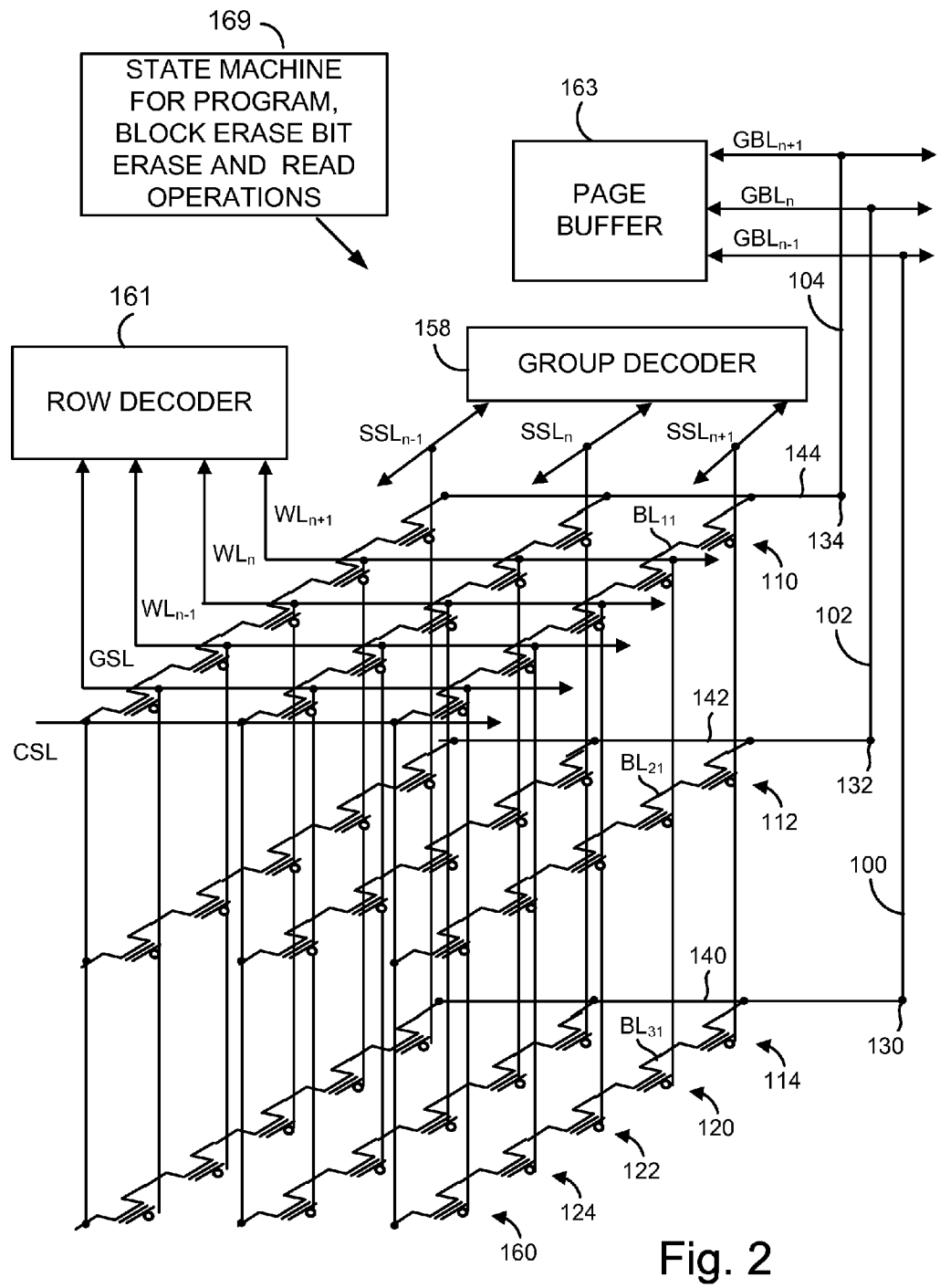
FIG. 2 is a schematic circuit diagram of a portion of a p-channel 3D NAND flash memory array.

FIG. 2 is a schematic diagram of a portion of the 3D NAND flash memory array usable in a device like that of FIG. 1. In this example, three levels of memory cells are illustrated, which is representative of a block of p-channel memory cells that can include many levels.

A plurality of word lines including word lines $WL_{n-1}$, $WL_n$, $WL_{n+1}$ extend in parallel along a first direction. The word lines are in electrical communication with row decoder 161. The word lines are connected to the gates of the memory cells, which are arranged in series as NAND strings. Word line $WL_n$ is representative of the word lines. As shown in FIG. 2, the word line $WL_n$ is vertically connected to the gates of the memory cells in each of the various levels underlying the word line $WL_n$.

A plurality of n-type semiconductor, local bit lines (for p-channel memory cells) is arranged along columns to form NAND strings in the various levels of the memory array. As shown in FIG. 2, the array includes a local bit line $BL_{31}$ on the third level, a local bit line $BL_{21}$ on the second level, and local bit line $BL_{11}$ on the first level. The memory cells have dielectric charge trapping structures between the corresponding word lines and the corresponding local bit lines. In this illustration, there are three memory cells in a NAND string for simplicity. For example, a NAND string formed by local bit line $BL_{31}$ on the third level comprises memory cells 120, 122, 124. In a typical implementation, a NAND string may comprise 16, 32 or more memory cells.

A plurality of string select lines including string select lines $SSL_{n-1}$, $SSL_n$, $SSL_{n+1}$ are in electrical communication with group decoder 158 (which could be part of the row decoder 161), which selects a group of strings. The string select lines are connected to the gates of string select transistors arranged at the first ends of the memory cell NAND strings. As shown in FIG. 2, each of the string select lines are vertically connected to the gates of a column of the string select transistors in each of the various levels. For example, string select line $SSL_{n+1}$ is connected to the gates of string select transistors SSL 110, 112, 114 in the three levels.

The local bit lines on a particular level are selectively coupled to an extension which can be implemented using a bit line pad as described herein, on the particular level by the corresponding string select transistors. For example, the local bit lines on the third level are selectively coupled to extension 140 by the corresponding string select transistors in that level. Similarly, the local bit lines on the second level are selectively coupled to extension 142, and local bit lines on the first level are selectively coupled to extension 144.

The extensions on each of the levels include a corresponding contact pad for contact with a vertical connector coupled to a corresponding global bit line. For example, extension 140 in the third level is coupled to a global bit line $GBL_{n-1}$ via contact pad 130 and vertical connector 100. Extension 142 on the second level is coupled to a global bit line $GBL_n$ via contact pad 132 and vertical connector 102. Extension 144 on the third level is coupled to a global bit line $GBL_{n+1}$ via contact pad 134 and vertical connector 104.

The global bit lines $GBL_{n-1}$, $GBL_n$, and $GBL_{n+1}$ are coupled to additional blocks (not shown) in the array and extend to page buffer 163.

Block select transistors are arranged at the second ends of the NAND strings. For example, block select transistor 160 (sometimes referred to as a ground select transistor) is arranged at the second end of the NAND string formed by memory cells 120, 122, 124. A ground select line GSL is connected to the gates of the block select transistors. The ground select line GSL is in electrical communication with the row decoder 161 to receive bias voltages during operations described herein.

The block select transistors are used to selectively couple second ends of all the NAND strings in the block to a reference voltage provided on a common source line CSL. The common source line CSL receives bias voltages from the bias circuit (not shown here) during operations described herein. In some operations described herein, the CSL is biased to a reference voltage that is higher in absolute magnitude than that of a bit line coupled to the opposite end of a NAND string, rather than in the more traditional "source" role.

The blocks can be arranged in an array of blocks, including rows of blocks and columns of blocks. Blocks in a row can share the same sets of word lines $WL_{n-1}$, $WL_n$, $WL_{n+1}$ and ground select lines GSL. Blocks in a column can share the same sets of global bit lines $GBL_{n-1}$, $GBL_n$, and $GBL_{n+1}$. In this manner, a 3D decoding network is established, selected memory cells which are part of a page can be accessed using one word line, and a set of global bit lines $GBL_{n-1}$, $GBL_n$, and $GBL_{n+1}$ and one string select line deliver data from cells selected in each level in parallel on the set of global bit lines $GBL_{n-1}$, $GBL_n$, and $GBL_{n+1}$.

The array shown in FIG. 2 includes p-channel NAND strings implemented in a horizontal configuration, with all the cells in a given string on the same level of the array. In alternative 3D arrangements, the NAND strings can be implemented in a vertical configuration. In some embodiments, the NAND strings are junction-free, in which there are no p-type terminals between the cells. P-type terminals can be implemented only on the sides of the SSL transistors (e.g. 110) that are connected to the bit line extensions (e.g. line 144), and on the sides of the GSL transistors (e.g. 160) that are connected to the common source line CSL. A state machine 169 is shown that in configured to control the memory array and supporting circuitry to perform read, program, block erase and bit erase operations.

Figure 3:
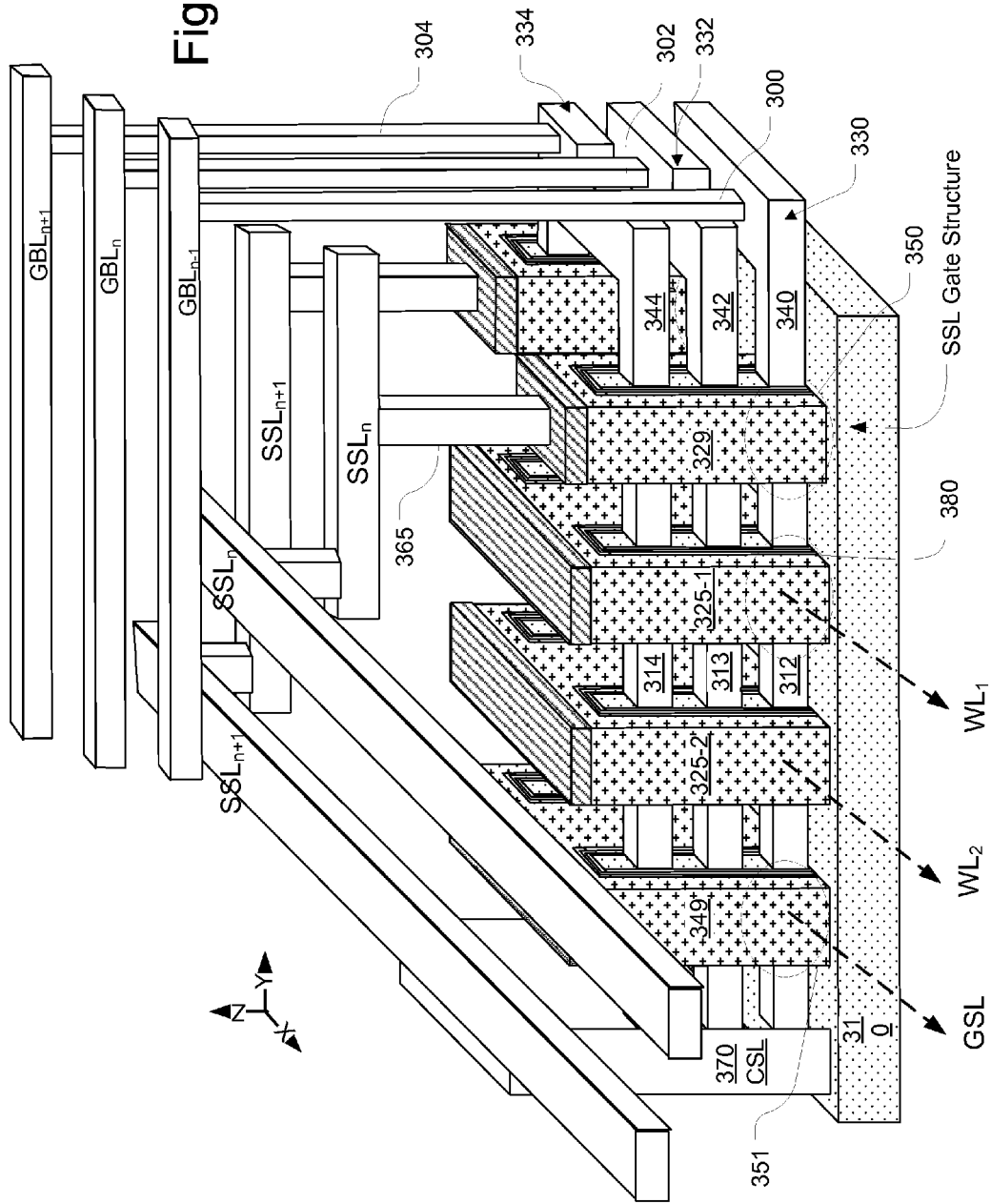
FIG. 3 is a perspective view of a portion of a horizontal bit line, 3D NAND flash memory array illustrating an array configuration for p-channel 3D NAND.

FIG. 3 is a perspective view of a portion of one example of a 3D NAND flash memory array with horizontal p-channel NAND strings. In FIG. 3, fill material has been removed to give a view of the word lines and bit lines that make up the 3D array.

The memory array is formed on an insulating layer 310 over an underlying semiconductor or other structures (not shown). The memory array includes a plurality of conductive lines 325-1, 325-2, acting as the word lines $WL_1$, $WL_2$, and arranged for connection to the row decoder. A layer of silicide can be formed on the top surfaces of the conductive lines 325-1, 325-2.

The conductive lines 325-1, 325-2 are conformal with semiconductor material strips acting as the local bit lines in the various levels. For example, semiconductor material strip 312 acts as a local bit line in the third level, semiconductor material strip 313 acts as a local bit line in the second level, and semiconductor material strip 314 acts as a local bit line in the first level. The semiconductor material strips are separated by insulating layers (not shown).

The semiconductor material strips are intrinsic or n-type semiconductor material, with p-type terminals at the SSL and GSL switches, resulting in p-channel flash memory cells. The conductive lines 325-1, 325-2 can be a semiconductor material with the same or a different conductivity type, or other conductive word line material. For example, the semiconductor material strips can be made using intrinsic or n-type polysilicon, or n-type single crystal silicon, while the conductive lines 325-1, 325-2 can be made using relatively heavily doped n+-type or p+-type polysilicon.

The memory cells have charge storage structures between the conductive lines 325-1, 325-2 and the semiconductor material strips acting as the local bit lines. For example, memory cell 380 is formed between conductive line 325-1 and semiconductor material strip 312 acting as a local bit line in the third level. In this illustration, there are two memory cells in a NAND string for simplicity. In the embodiment of FIG. 3, each memory cell is a double gate field effect transistor having active charge storage regions on both sides of the interface between the corresponding semiconductor material strip and the conductive lines 325-1, 325-2.

In this example the charge storage structures comprise a tunneling layer, a charge trapping layer, and a blocking layer. In one embodiment, the tunneling layer is silicon oxide (O), the charge storage layer is silicon nitride (N), and the blocking dielectric layer is silicon oxide (O). Alternatively, the memory cells may comprise other charge storage structures, including for example silicon oxynitride ($Si_xO_yN_z$), silicon-rich nitride, silicon-rich oxide, trapping layers including embedded nanoparticles, and so on.

In one embodiment, a bandgap engineered SONOS (BE-SONOS) charge storage structure can be used which includes a dielectric tunneling layer that includes a combination of materials forming an inverted "U" shaped valence band under zero bias. In one embodiment, the composite tunneling dielectric layer includes a first layer referred to as a hole tunneling layer, a second layer referred to as a band offset layer, and a third layer referred to as an isolation layer. The hole tunneling layer of the layer in this embodiment comprises silicon dioxide formed on the side surface of the semiconductor material strips using for example in-situ steam generation ISSG with optional nitridation by either a post deposition NO anneal or by addition of NO to the ambient during deposition. The thickness of the first layer of silicon dioxide is less than 20 Å, and preferably 15 Å or less. Representative embodiments can be 10 Å or 12 Åthick.

String select lines $SSL_n$, $SSL_{n+1}$ are connected to gates of string select transistors at the first ends of the memory cell NAND strings. The string select transistors are formed between the semiconductor material strip of the corresponding NAND string and a multi-level string select gate structure. For example, string select transistor 350 is formed between the semiconductor material strip 312 and the string select gate structure 329. The string select gate structure 329 is coupled to the string select line $SSL_n$ via contact plug 365.

The semiconductor material strips are selectively coupled to the other semiconductor material strips in the same level by extensions to bit line pads 330, 332, 334. For example, the semiconductor material strips in the third level are selectively coupled to one another via extension 340 to pad 330. Similarly, the semiconductor material strips in the second level are selectively coupled to one another via extension 342 to pad 332, and the semiconductor material strips in the first level are selectively coupled to extension 344 to pad 334.

Extension 340 in the third level is coupled to a global bit line $GBL_{n-1}$ via contact pad 330 and vertical connector 300. Extension 342 in the second level is coupled to a global bit line $GBL_n$ via contact pad 332 and vertical connector 302. Extension 344 on the third level is coupled to a global bit line $GBL_{n+1}$ via contact pad 334 and vertical connector 304.

The global bit lines $GBL_{n-1}$, $GBL_n$, and $GBL_{n+1}$ are coupled to additional blocks (not shown) in the array and extend to page buffer 263.

Block select transistors are arranged at the second ends of the NAND strings. For example, block select transistor 351 is arranged at the second end of the NAND string formed by semiconductor material strip 312. Gate structure 349, acting as ground select line GSL, is connected to the gates of the block select transistors.

The block select transistors are used to selectively couple second ends of all the NAND strings in the block to a reference voltage provided on common source line CSL 370. CSL 370 extends parallel with the word lines.

The structure illustrated in FIG. 3 can be manufactured for example utilizing the techniques described in commonly owned U.S. Patent Application Publication No. US 2012/0007167, published 12 Jan. 2012, and filed 31 Jan. 2011, entitled 3D MEMORY ARRAY WITH IMPROVED SSL AND BL CONTACT LAYOUT which is incorporated by reference herein as if fully set forth herein.

In operation, each of the memory cells stores a data value depending upon its threshold voltage. Reading or writing of a selected memory cell can be achieved by applying appropriate voltages to the word lines, bit lines, string select lines, ground select line and common source line. The "junction-free" NAND structure provides excellent short-channel device performance for p-channel 3D NAND. A 3D Vertical Gate (VG) NAND architecture with 37.5 nm half pitch WL has been implemented. Array word line CD (channel length) in this implementation was about 25 nm, while the bit line critical dimension in this implementation was about 30 nm. Each memory cell in the implemented example is a double-gate, thin film transistor TFT BE-SONOS charge-trapping device.

Figure 4:
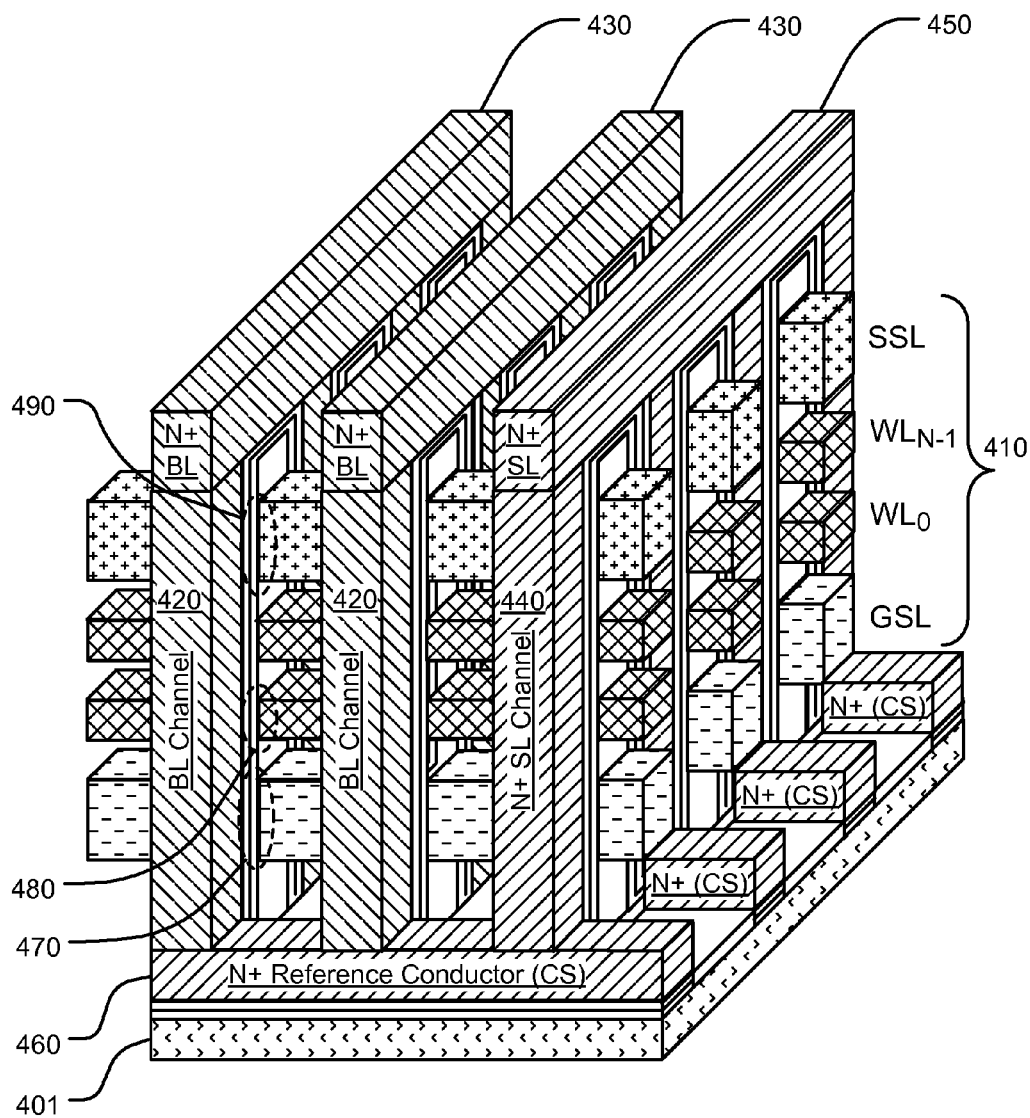
FIG. 4 is a perspective view of a portion of a vertical bit line, 3D NAND flash memory array illustrating an array configuration for p-channel embodiments.

FIG. 4 is a schematic diagram of an example of a three-dimensional (3D) memory device having vertical, junction-free, p-channel NAND strings. The memory device 400 includes an array of NAND strings of memory cells, and can be a double-gate vertical channel memory array (DGVC). The memory device 400 includes an integrated circuit substrate, and a plurality of stacks of conductive strips separated by insulating material, including at least a bottom plane of conductive strips (GSL), a plurality of intermediate planes of conductive strips (WLs), and a top plane of conductive strips (SSLs). In the example shown in FIG. 4, a stack 410 includes a bottom plane of conductive strips (GSL), a plurality of intermediate planes of conductive strips (WLs) ranging from $WL_0$ to $WL_{N-1}$, and a top plane of conductive strips (SSLs), where N can be 8, 16, 32, 64 and so on.

The plurality of bit line structures are arranged orthogonally over, and have surfaces conformal with, the plurality of stacks, including inter-stack semiconductor body elements 420 between the stacks and linking elements 430 over the stacks connecting the inter-stack semiconductor body elements 420. The linking elements 430 in this example comprise a semiconductor, such as polysilicon, having a relatively high doping concentration so that they have higher conductivity than the inter-stack semiconductor body elements 420, which are configured to provide channel regions for the cells in the stacks.

The memory device includes charge storage structures in interface regions at cross-points 480 between side surfaces of the conductive strips in the plurality of intermediate planes (WLs) in the stacks and the inter-stack semiconductor body elements 420 of the plurality of bit line structures. In the illustrated example, the memory cells in the cross-points 480 are configured in vertical, dual-gate NAND strings, where the conductive strips on both sides of a single inter-stack semiconductor body element behave as dual-gates, and can be operated cooperatively for read, erase and program operations.

A reference conductor 460 is disposed between the bottom plane (GSL) of conductive strips and the integrated circuit substrate (not shown). At least one reference line structure is arranged orthogonally over the plurality of stacks, including inter-stack vertical conductive elements 440 between the stacks in electrical communication with the reference conductor 460, and linking elements 450 over the stacks 410 connecting the inter-stack vertical conductive elements 440. The inter-stack vertical conductive elements 440 can have a higher conductivity than the inter-stack semiconductor body elements 420.

The memory device includes string select switches 490 at interface regions with the top plane of conductive strips, and reference select switches 470 at interface regions with the bottom plane (GSL) of conductive strips. The dielectric layers of the charge storage structure can act as gate dielectric layers for the switches 470, 490 in some examples.

The memory device includes a first overlying patterned conductive layer (not shown) connected to the plurality of bit line structures, including a plurality of global bit lines coupled to sensing circuits. The memory device also includes a second overlying conductive layer (not shown), which can be patterned, and can be above or below the first patterned conductor layer. The second overlying conductive layer is connected to the at least one reference line structure, such as by contact to the linking element 450. The second patterned conductor layer can connect the at least one reference line structure to a reference voltage source, or to circuitry for providing a reference voltage.

In the example shown in FIG. 4, p-channel memory cells are implemented, so the BL channel elements 420 comprise n-type semiconductor material, such n-type polysilicon. The linking elements 430 of the bit line structures can include N+ doped semiconductor material. The inter-stack semiconductor body elements 420 of the bit line structures include lightly doped semiconductor material. In the example shown in FIG. 4, the reference conductor 460 includes N+ doped semiconductor material, and the linking elements 450 of the at least one reference line structure include N+ doped semiconductor material. The inter-stack vertical conductive elements 440 of the at least one reference line structure also include N+ doped semiconductor material. In alternative implementations a metal or metal compound can be used in place of the doped semiconductors.

In one embodiment, in order to reduce the resistance of the reference conductor 460, the memory device can include a bottom gate 401 near the reference conductor 460. During read operations, the bottom gate 401 can be turned on by a suitable pass voltage applied to an underlying doped well or wells in the substrate, or other underlying patterned conductor structures, to increase the conductivity of the reference conductor 460. The embodiment of FIG. 4 can be implemented for example as described in my co-pending U.S. patent application Ser. No. 13/772,058, filed 20 Feb. 2013, entitled 3D NAND FLASH MEMORY, which is incorporated by reference as if fully set forth herein.

Figure 5:
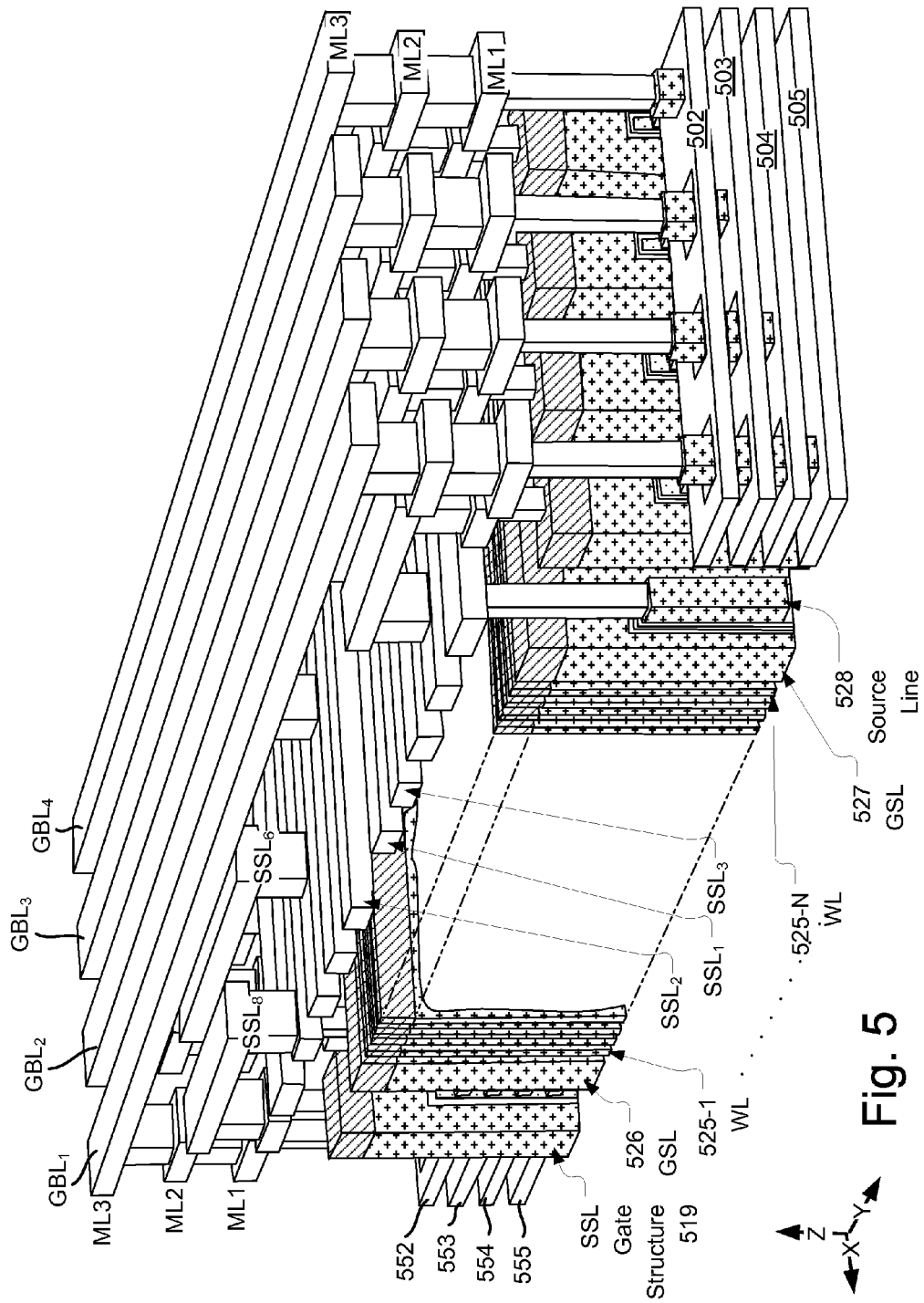
FIG. 5 is a perspective illustration of a 3D NAND flash memory split page array structure having global bit lines which are each coupled to a plurality of levels of memory cells for p-channel embodiments.

FIG. 5 is a perspective illustration of another example of a 3D NAND flash memory array structure in a split page configuration having global bit lines which are each coupled to a plurality of levels of memory cells, and in which programming and erasing operations described herein can be applied. In the illustrated example, four levels of memory cells are illustrated, which is representative of a block of memory cells that can include many levels.

Insulating material is removed from the drawing to expose additional structure. For example, insulating layers are removed between the semiconductor strips, in the ridge-shaped stacks, and are removed between the ridge-shaped stacks of semiconductor strips.

The multilayer array is formed on an insulating layer, and includes a plurality of conductive lines 525-1, . . . , 525-n−1, 525-n conformal with the plurality of ridge-shaped stacks, and which act as word lines WLn, WLn−1, . . . WL1. The plurality of ridge-shaped stacks includes semiconductor strips acting as local bit lines. Semiconductor strips in the same level are electrically coupled together by extensions having contact pads arranged in a stair step manner.

The shown word line numbering, ascending from 1 to N going from the back to the front of the overall structure, applies to even memory pages. For odd memory pages, the word line numbering descends from N to 1 going from the back to the front of the overall structure.

As illustrated, the extensions 502, 503, 504, 505 on a first end of the block are electrically connected to different global bit lines GBL1 to GBL4. Similarly, the extensions 552, 553, 554, 555 are electrically connected to different global bit lines GBL1 to GBL4.

Any given stack of semiconductor strips is coupled to either the extensions 502, 503, 504, 505, or the extensions 552, 553, 554, 555, but not both. A stack of semiconductor strips has one of the two opposite orientations of bit line end-to-source line end orientation, or source line end-to-bit line end orientation.

The stacks of semiconductor strips terminated at one end by the extensions 552, 553, 554, 555, pass through SSL gate structure 519, ground select line GSL 526, word lines 525-1 WL through 525-N WL, ground select line GSL 527, and terminate at the other end by source line 528. These stacks of semiconductor strips do not reach the extensions 502, 503, 504, 505.

The stacks of semiconductor strips terminate at one end by the extensions 502, 503, 504, 505, pass through SSL gate structure 509, ground select line GSL 527, word lines 525-N WL through 525-1 WL, ground select line GSL 526, and terminate at the other end by a source line (obscured by other parts of figure). These stacks of semiconductor strips do not reach the extensions 552, 553, 554, 555.

Charge storage structures separate the word lines 525-1 through 525-n, from the semiconductor strips. Ground select lines GSL 526 and GSL 527 are conformal with the plurality of ridge-shaped stacks, similar to the word lines.

Global bit lines GBL1 to GBL4 are formed at the metal layers ML1, ML2, and ML3. Although obscured by other parts of figure, in the illustrated example, each global bit line GBL1 to GBL4 is coupled to two different levels of the block of memory cells. For example, in the illustration, the global bit line GBL1 is coupled to extension 505 which is connected to a set of semiconductor strips acting as local bit lines in the fourth level, and is coupled to extension 552 which is connected to a set of semiconductor strips acting as local bit lines in the first level.

In the example of FIG. 5, the global bit lines GBL1 to GBL8 are patterned in a third metal layer, while string select lines SSL1 to SSL8 are patterned in first and second metal layers. The string select signals are coupled to string select transistors on alternating ends of the blocks, via a first metal segment parallel with the underlying string, and a second metal segment parallel with the word lines.

FIG. 6A is a circuit diagram showing a slice in a 3D NAND array (Y-Z plane), in which four p-channel NAND strings 601, 602, 603, 604 including p-channel memory cells (e.g. 613). The illustrated strings 601, 602, 603, 604 can be disposed on separate levels of the 3D array like that of FIG. 5, sharing SSL lines and GSL lines, and coupled to respective global bit lines BL-1 to BL-4 (for example via a stair step contact structure like that shown in FIG. 5) and to a common source CS line 605. The strings are connected to the corresponding global bit lines BL-1 to BL-4 by respective p-channel string select transistors (e.g. 612). The strings are connected to the common source line for the slice by respective p-channel ground select transistors (e.g. 611).

A grounded bit line, block erase bias arrangement, including the voltages shown, is illustrated, which can be applied to erase a block 620 of cells in the slice. The block 620 can include all the slices in a given 3D block of cells by biasing all of the SSL lines that are coupled to the other slices in the 3D unit, with voltages that turn on the string select transistors. For the block erase configuration of FIG. 6A, the first switch transistor 611 is biased by −4 V on the GSL line to couple the NAND string to the CS line 605. The second switch transistor 612 is biased by −4 V on the SSL line to couple the NAND string to the selected bit line BL-1. All the bit lines BL-1 to BL-4 and the common source CS line 605 are biased at a low voltage such as 0 V, allowing hole current in the local bit lines of the NAND strings. All the word lines in the slice WL(0) to WL(N−1) are coupled to an erase voltage such as −18 V. As a result, the NAND string channels are driven to a low voltage near 0V while the word lines are set an erase potential, setting up an electric field at each memory cell in the block that induces negative gate, Fowler Nordheim (−FN) hole tunneling to the charge storage structures in the memory cells, thereby lowering the threshold voltages.

Although the erase voltage and bit line voltage illustrated will establish an electric field based on the potential difference of −18 V, that voltage will vary as suits a particular implementation, ranging for example from about −13 V to about −20 V. Also, the erase operation applying the erase bias configuration may include a number of iterations in which the voltages are pulsed to cause the erase function.

Figure 6B:
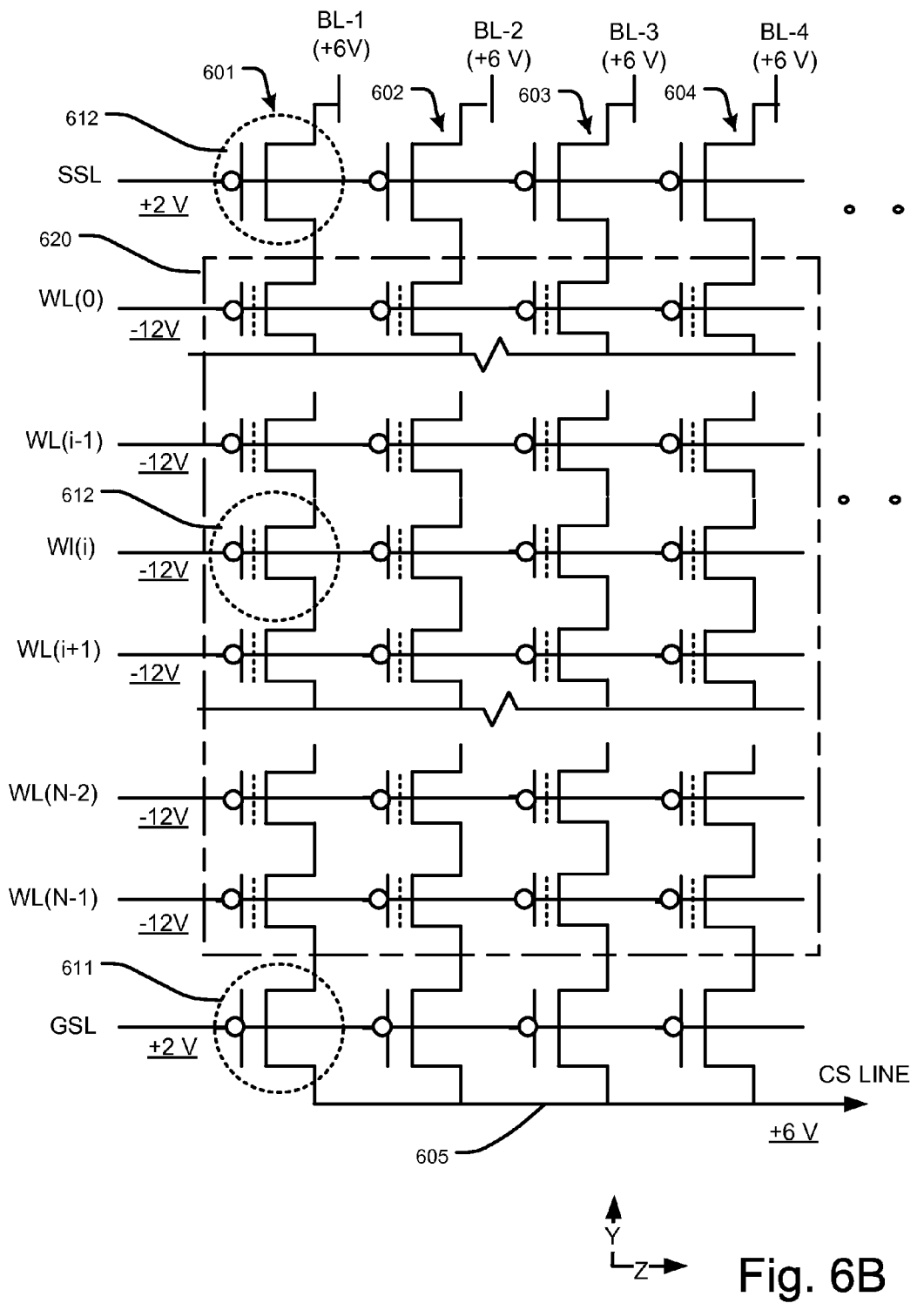
FIG. 6B is a schematic diagram of a slice of a p-channel 3D NAND structure showing a bias arrangement for block erase using divided voltages.

FIG. 6B shows the same circuit diagram as FIG. 6A, with a divided voltage, block erase bias arrangement. The electric fields needed for −FN hole tunneling block erase can be established using lower absolute magnitude voltages on the circuitry, using a divided voltage approach. In this example, all of the voltages are increased by +6V, reducing the absolute magnitude of the word line voltages, changing them from −18V to −12 V. These lower absolute magnitude voltages reduce the high voltage specifications for peripheral circuits needed to generate and distribute them into the array.

A block erase operation as described with reference to FIGS. 6A and 6B is induced by applying relatively high negative voltages to the word lines in the block, relative to the semiconductor body of the channel in the NAND string. It may be preferred to divide the voltage between the gate and the bit line/common source line bias to relax the maximum operating voltage of the peripheral circuitry.

It is found that n-channel NAND suffers a time lag (on the order of, though possibly less than, 1 millisecond) at the initiation of −FN tunneling erase, because the minority carrier (hole) takes time to be generated. On the other hand, there is no such initial erase lag in p-channel 3D NAND and the memory window is larger. It is also found that SSL/GSL has negligible disturb during erase (not shown).

Figure 7A:
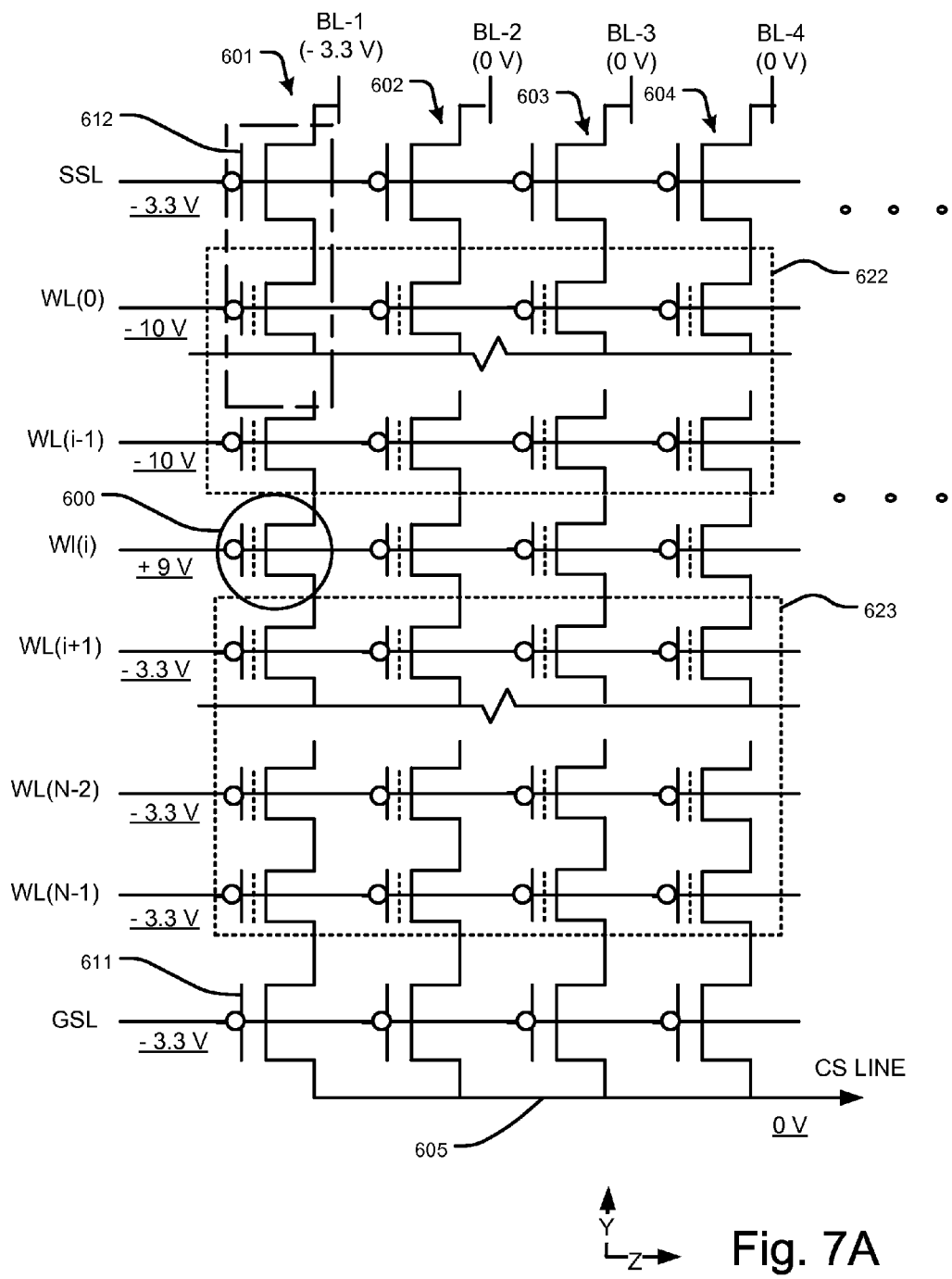
FIG. 7A is a schematic diagram of a slice of a p-channel 3D NAND structure showing a bias arrangement for a program operation.

FIG. 7A shows the circuit illustrated in FIG. 6A, with a program bias arrangement, including the voltages shown, which can be applied to program a selected memory cell 600 in the slice, by inducing band-to-band, hot electron tunneling current to increase the threshold of the selected memory cell. For the program bias arrangement of FIG. 7A, the first switch transistor 611 is biased by −3.3 V on the GSL line to couple the NAND string to the CS line 605. The second switch transistor 612 is biased by −3.3 V on the SSL line to couple the NAND string to the selected bit line BL-1. The selected bit line BL-1 is biased at −3.3 V. The common source CS line 605 is biased at a low voltage such as 0 V.

The selected word line WL(i), is biased at a program voltage which, for a given memory structure, can range from about +6 V to +15 V, and may be about +9 V, as shown. The unselected word lines WL(0) to WL(i−1) on the drain side are biased at a drain side pass voltage allowing current from the bit line, which drain side pass voltage for a given memory structure can range from about −9 V to −17 V, and may be about −10 V as shown. The unselected word lines on the source side WL(i+1) to WL(N−1) are biased at a source side pass voltage, which source side pass voltage for a given memory structure can be about −3.3 V, as shown.

Unselected bit lines BL-2 to BL-4 are biased about an inhibit level, which can be about 0 V.

As a result, the drain side (region 622) of the selected memory cell in the NAND string channels is isolated from the bit line and boosted negatively as a result of the drain side pass voltage pulses, while the source side (region 623) of the selected memory cell in the NAND string is coupled to the CS line and reaches a voltage near 0V. The positive program voltage pulse on the selected memory cell turns off the cell. The high positive voltage on the selected word line and negative voltage on the drain side produces a field that causes band-to-band tunneling electron current on the drain side, providing hot electrons for tunneling to the charge storage structure. The source side (region 623) of the selected memory cell, however, is coupled to a voltage near 0 V, so that the heating field and band-to-band tunneling current are low. As a result of the tunneling current on the drain side, the threshold of the selected memory cell is increased.

Unselected memory cells on the selected bit line will not see a heating field, and will not be significantly disturbed by the program operation. Unselected memory cells on the other bit lines that share the selected word line, will have a voltage near 0 V on both the source side and the drain side, so that the heating field is not sufficient to cause significant disturbance. In adjacent slices, the SSL bias will block coupling to the bit lines, so that capacitive boosting will prevent formation of electric fields capable of significant disturbance of the cells.

Although the program voltage, pass voltages and bit line voltage illustrated will establish an electric field based on the potential difference between about +9 V and −3.3 V, that voltage will vary as suits a particular implementation. Also, the program operation applying the program bias arrangement may include a number of iterations in which the voltages are pulsed.

Figure 7B:
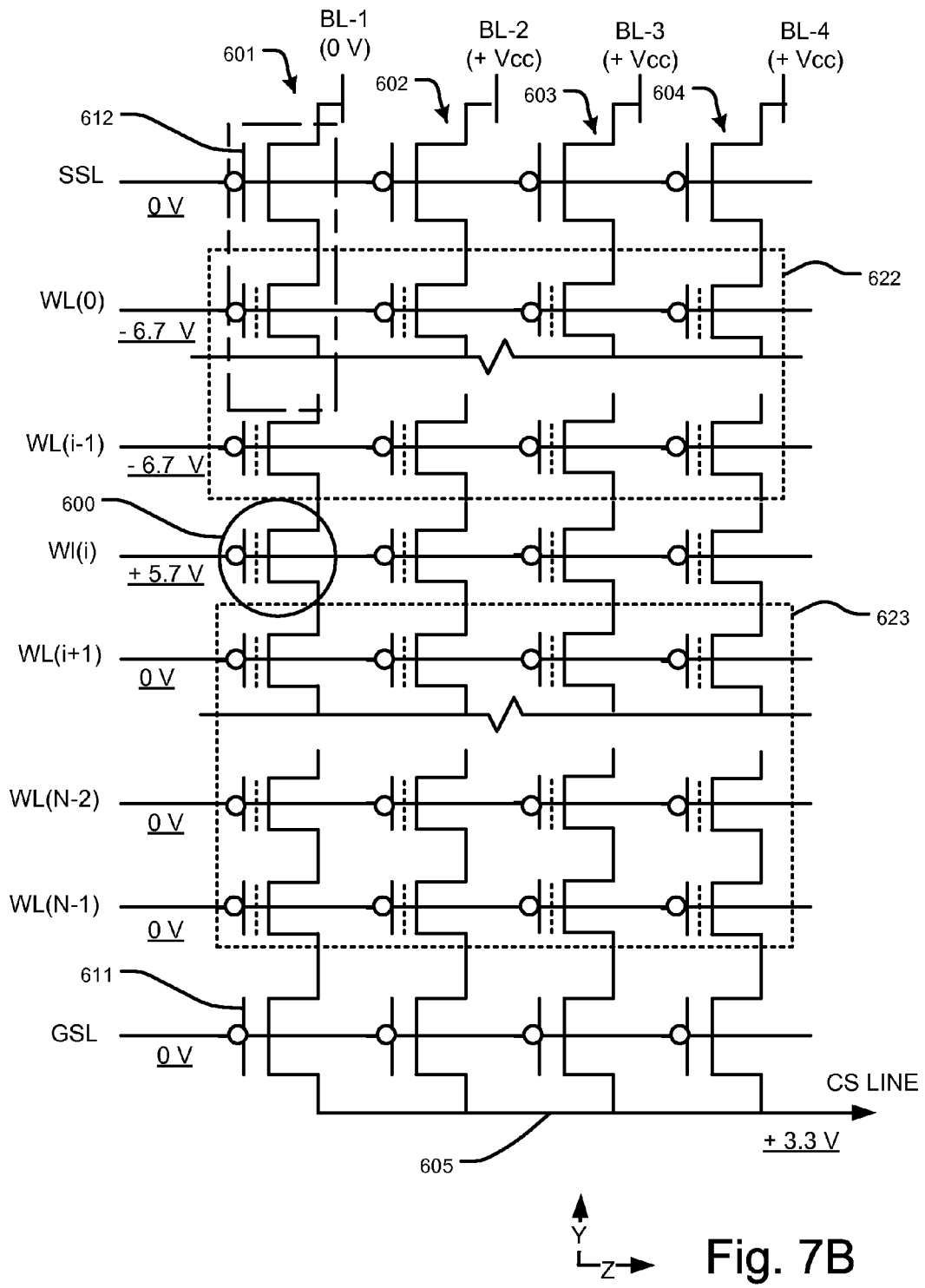
FIG. 7B is a schematic diagram of a slice of a p-channel 3D NAND structure showing a bias arrangement for a program operation using divided voltages.

FIG. 7B shows the same circuit diagram as FIG. 7A, with a divided voltage, program bias arrangement. The electric fields needed for band-to-band hot electron tunneling in a selected memory cell can be established using lower absolute magnitude voltages on the circuitry, using a divided voltage approach. In this example, all of the voltages are increased by 3.3 V (3.3 V is about Vcc in some embodiments), resulting in non-negative bit line voltages. These non-negative bit line voltages reduce the complexity required for implementation of page buffers, for example, and other bit line related circuitry used with the memory array. This can result in a 3D memory array in which read, program and erase operations can be executed without negative voltages on the bit lines.

Figure 8:
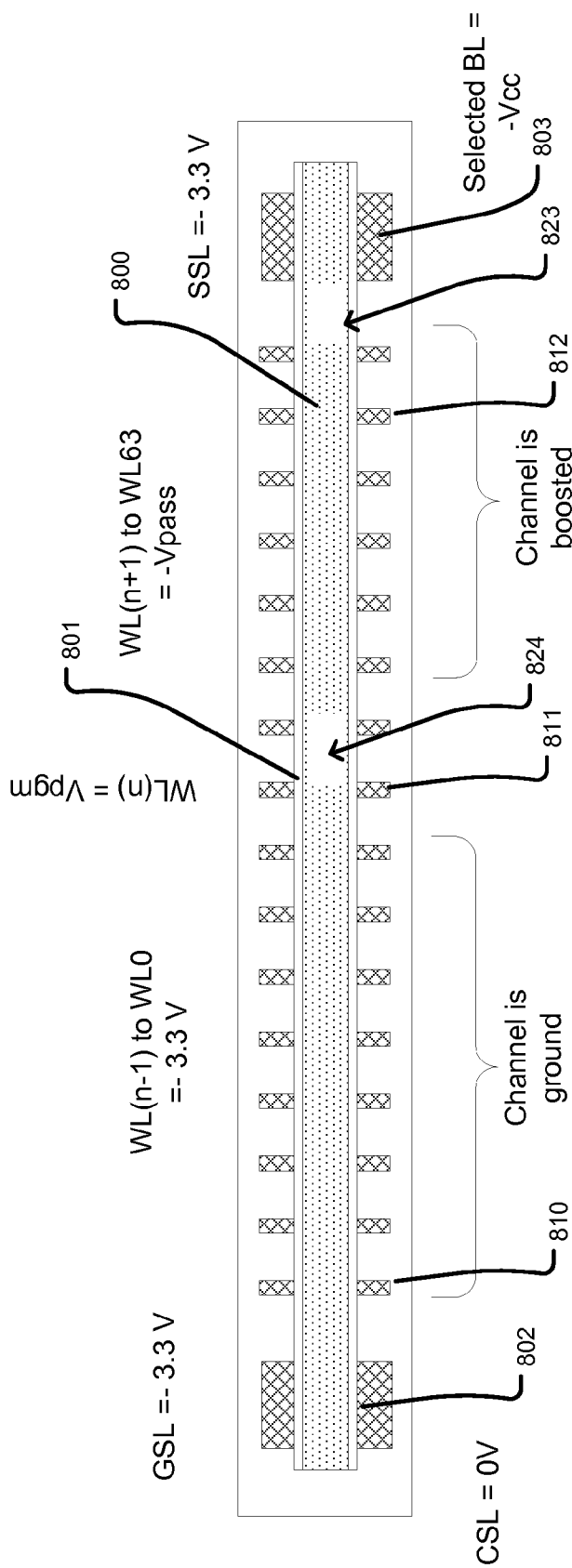
FIG. 8 illustrates results of a simulation of band-to-band tunneling current intensity for a dual gate, p-channel, thin film NAND string, such as used in the 3D array of FIG. 5.

FIG. 8 is an illustration (color removed) of a simulation which illustrates the band-to-band current generation rate under a program bias arrangement as described herein. A semiconductor strip 800 is illustrated in layout view. The semiconductor strip 800 may correspond to one of the strips in the structure illustrated in FIG. 5 for example. On both sides of the strip 800, a layer is illustrated that comprises the charge storage structure 801. For example, the charge storage structure 801 may be a multilayer dielectric charge trapping structure, such as the BE-SONOS structure described above. The string select line SSL 803, which extends vertically between the stacks, appears as a dual gate structure (SSL 803 on both sides) on one end of the strip 800. Likewise, the ground select line GSL 802 which extends vertically between the stacks, appears as a dual gate structure on the opposite end of the strip 800. The word line structures (e.g. 810, 811, 812) likewise establish dual gate memory cell regions along the strip. The strip is a junction-free structure, where the semiconductor material of the strip 800 is all n-type, without p-type junctions between the word lines. For the simulation, the voltages applied to the various components are illustrated in the drawing. As a result of the common source line bias of 0 V, and the GSL bias of −3.3 V, the channel on the source side of the selected word line WL(n) is coupled to ground voltage. As a result of the bit line bias of −3.3 V along with the SSL bias of −3.3 V, the channel on the drain side of the selected word line WL(n) is isolated while the high positive voltage on the selected memory cell isolates the drain side from the source side, and thereby is boosted by the pass voltage pulses (−Vpass) applied to the word lines WL(n+1) to WL63.

Band-to-band hot electron generation is seen in the region 823 at a relatively low level between them SSL gate structure 803 and the word line WL63. Any disturbance which might result from this field is avoided by placing a dummy cell there that is not utilized for data storage, such as by using outside word lines of the NAND string, or extra word lines, as dummy word lines not utilized for data storage.

Band-to-band hot electron generation is relatively intense in the region 824 between the selected word line WL(n), and the adjacent word line WL (n+1) on the drain side. Although not illustrated in this version of the figure, the band-to-band hot electron current density increases near the channel of the dual gate structure (word line structure 811 on both sides) under the selected word line WL (n).

Because the channel is locally boosted near the word lines WL(n+1) to WL63, a large lateral electric field is induced that generates a high band-to-band tunneling current, providing hot electrons for hot electron injection in the selected memory cell. The relatively high positive voltage applied to the selected word line cuts off the current flow through the P-channel NAND string. The relatively high density of electron-hole pairs generated by the band-to-band tunneling is accelerated by the lateral electric field set up by the word line voltage on the selected memory cell, resulting in hot carrier injection.

Figure 9:
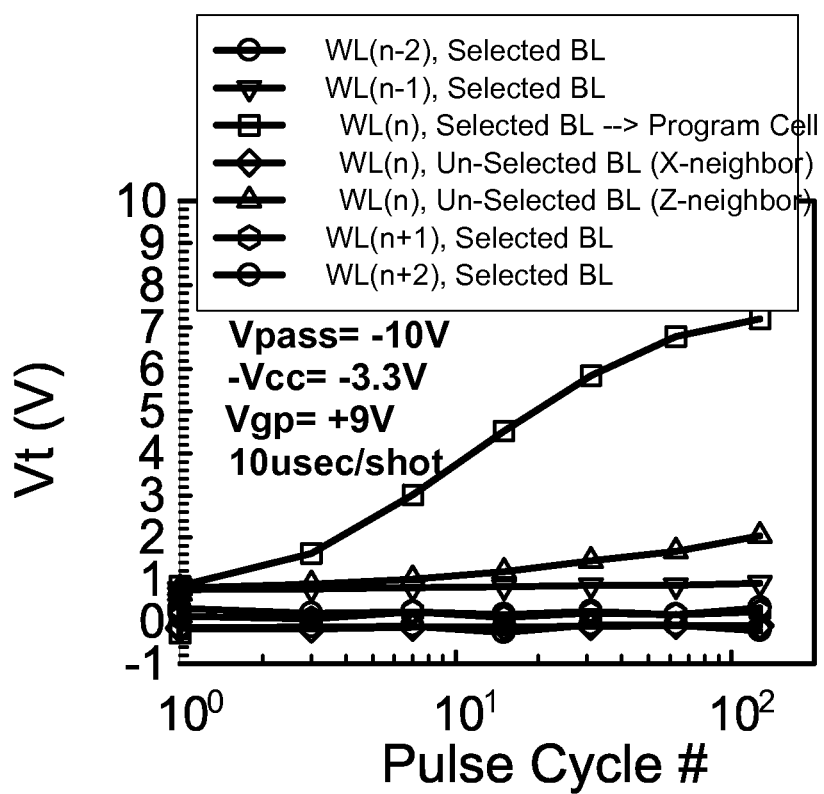
FIGS. 9-11 are graphs illustrating program performance for a p-channel 3D NAND structure.

FIG. 9 is a graph of threshold voltage Vt on the vertical axis, and pulse cycle count on the horizontal axis, which programming performance with various pulse cycling counts on the target cell illustrated on trace 900, and on neighbor cells which might be disturbed by the program bias arrangement. Trace 901 corresponds to the vertical neighbor cell (Z-direction neighbor) in a semiconductor strip overlying the strip of the target cell for the structure of FIG. 5, which shares the same word line as the target cell, and shows a slight disturbance and threshold voltage. This can be managed by configuration of the sequence of layers accessed in programming operation that can prevent vertical neighbor disturbance. Traces 902 through 906 (not readily distinguishable in the graph) correspond to cells on the same strip as the target cell (Y-direction neighbors), and a cell in the same layer of the 3D structure but in an adjacent strip (X-direction neighbor).

Figure 10:
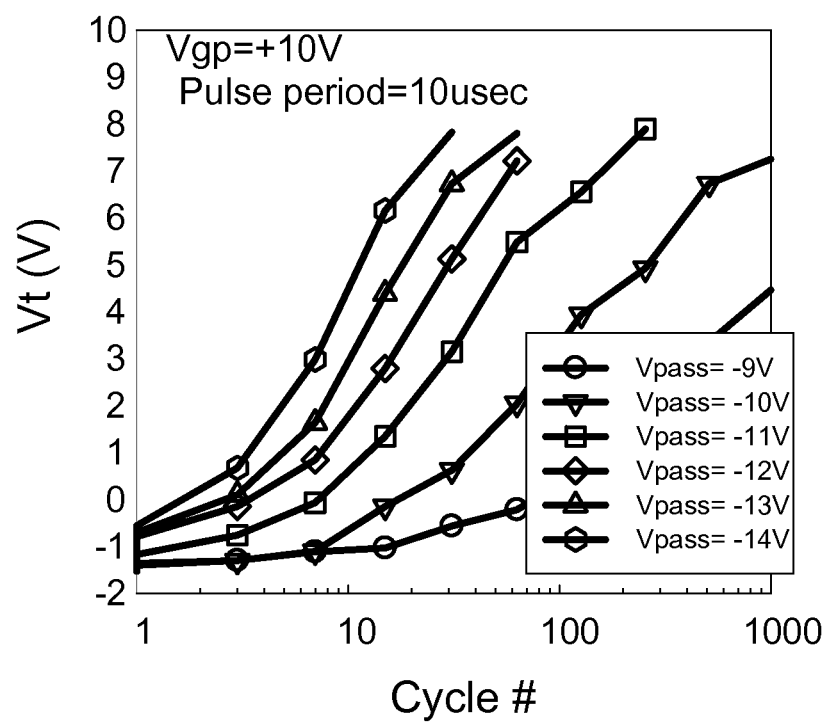

FIG. 10 is a graph of threshold voltage Vt of the target cell on the vertical axis, and cycle count for program pulses on the horizontal axis. The value Vgp is the programming voltage applied to the word line of the selected memory cell. Trace 950 illustrates the programming performance for a drain side pass voltage of −14 volts. Trace 951 illustrates the programming performance for a drain side pass voltage of −13 volts. Trace 952 illustrates the programming performance for a drain side pass voltage of −12 volts. Trace 953 illustrates the programming performance for a drain side pass voltage of −11 volts. Trace 954 illustrates the programming performance for a drain side pass voltage of −10 volts. Trace 955 illustrates the programming performance for a drain side pass voltage of −9 volts. Increasing the pass voltage increases the programming speed significantly.

Figure 11:
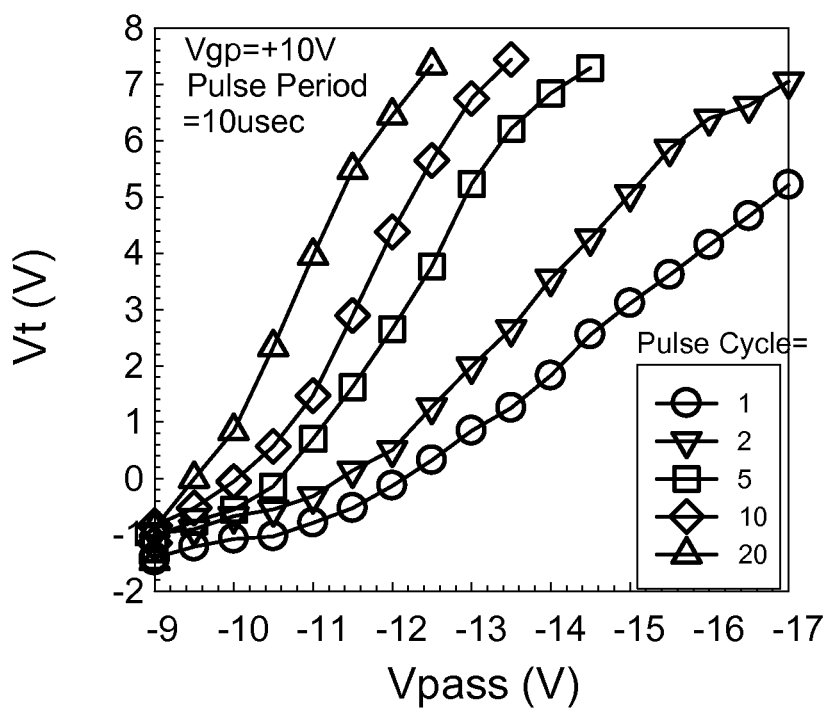

FIG. 11 is a graph of threshold voltage Vt of the target cell on the vertical axis, and drain side pass voltage on the horizontal axis. Each of the traces corresponds to the threshold after a certain number of program pulses. Thus, trace 970 corresponds to the performance after 20 program pulses. Trace 971 corresponds to 10 program pulses. Trace 972 corresponds to five program pulses. Trace 973 corresponds to 2 program pulses. Trace 974 corresponds to the performance for a single program pulse. This illustrates that a programming operation that steps the pass voltage can be efficient, and can provide a relatively linear relationship between the threshold voltage and the pass voltage.

Figure 12:
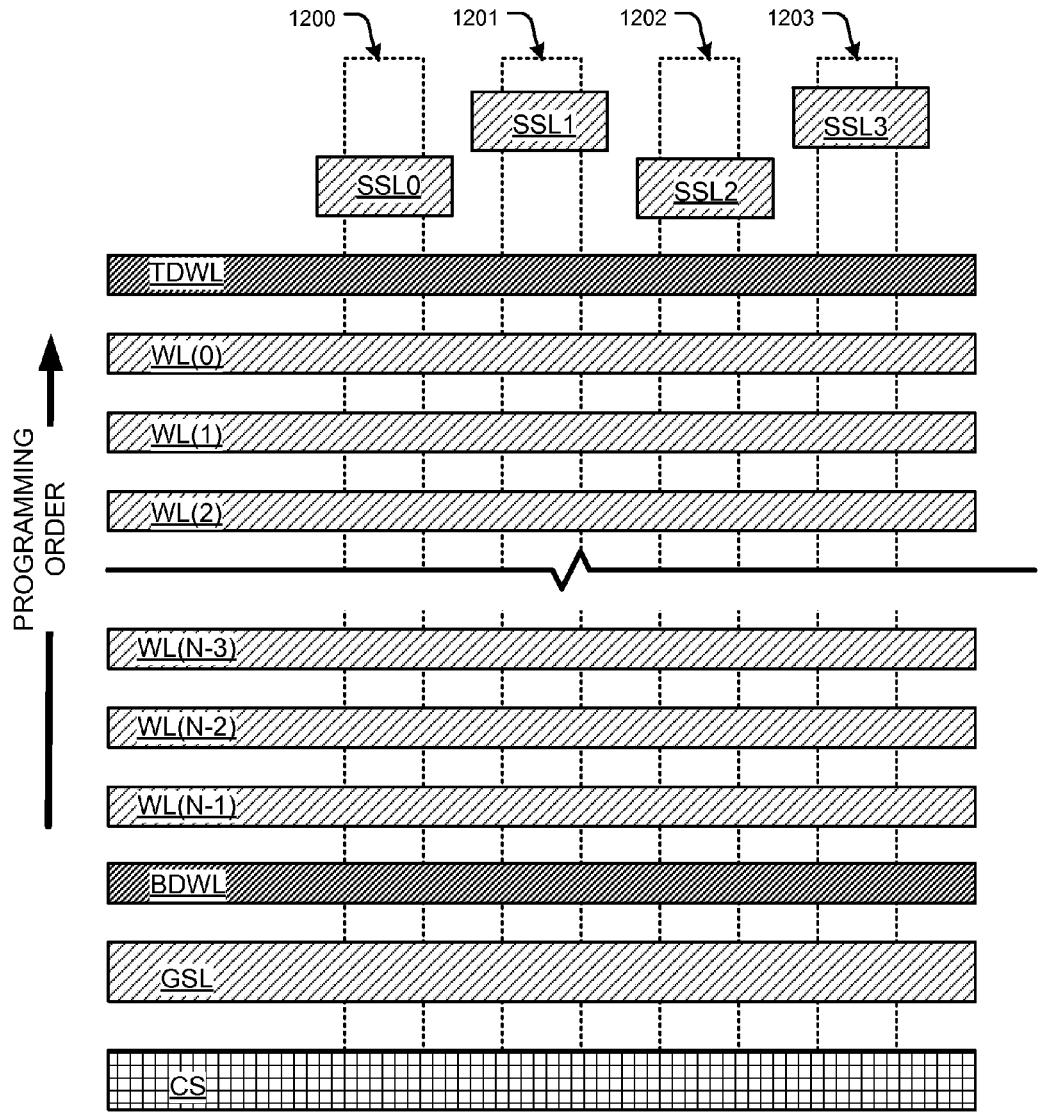
FIG. 12 illustrates a layout with dummy word lines for a p-channel 3D NAND structure.

FIG. 12 illustrates a plan view layout for word lines over the stacks of semiconductor strips 1200-1203. In this example, the string select gates SSL are disposed along the top of the strip, and the ground select line GSL is disposed along the bottom of the strip. Each of the strips terminates in a common source line CS. Word lines WL(0) to WL(N−1) traverse the strip as well. A top dummy word line TDWL is disposed along the top of the strips, and a bottom dummy word line BDWL is disposed along the bottom. The dummy word lines provide a buffer for the memory cells being utilized from disturb caused by, and event handling between the, string select lines and the memory cells, and other bias configurations.

In a preferred example, a programming sequence for the memory cells along the strip is executed in order to minimize disturbance of already programmed cells as a result of the relatively high negative drain side pass voltages. These negative drain side pass voltages can cause charge leakage reducing the threshold voltage of the high threshold cells. To reduce disturbance, a program sequence can be executed beginning at the first word line on the source side, WL(N−1) in this example. After programming target cells on the first word line, each of the word lines is utilized in sequence from the bottom to the top to minimize any disturbance of freshly program cells. Also, any program cells in the string that might be disturbed by programming of the neighbor cells, can be reprogrammed in the sequence.

Figure 13:
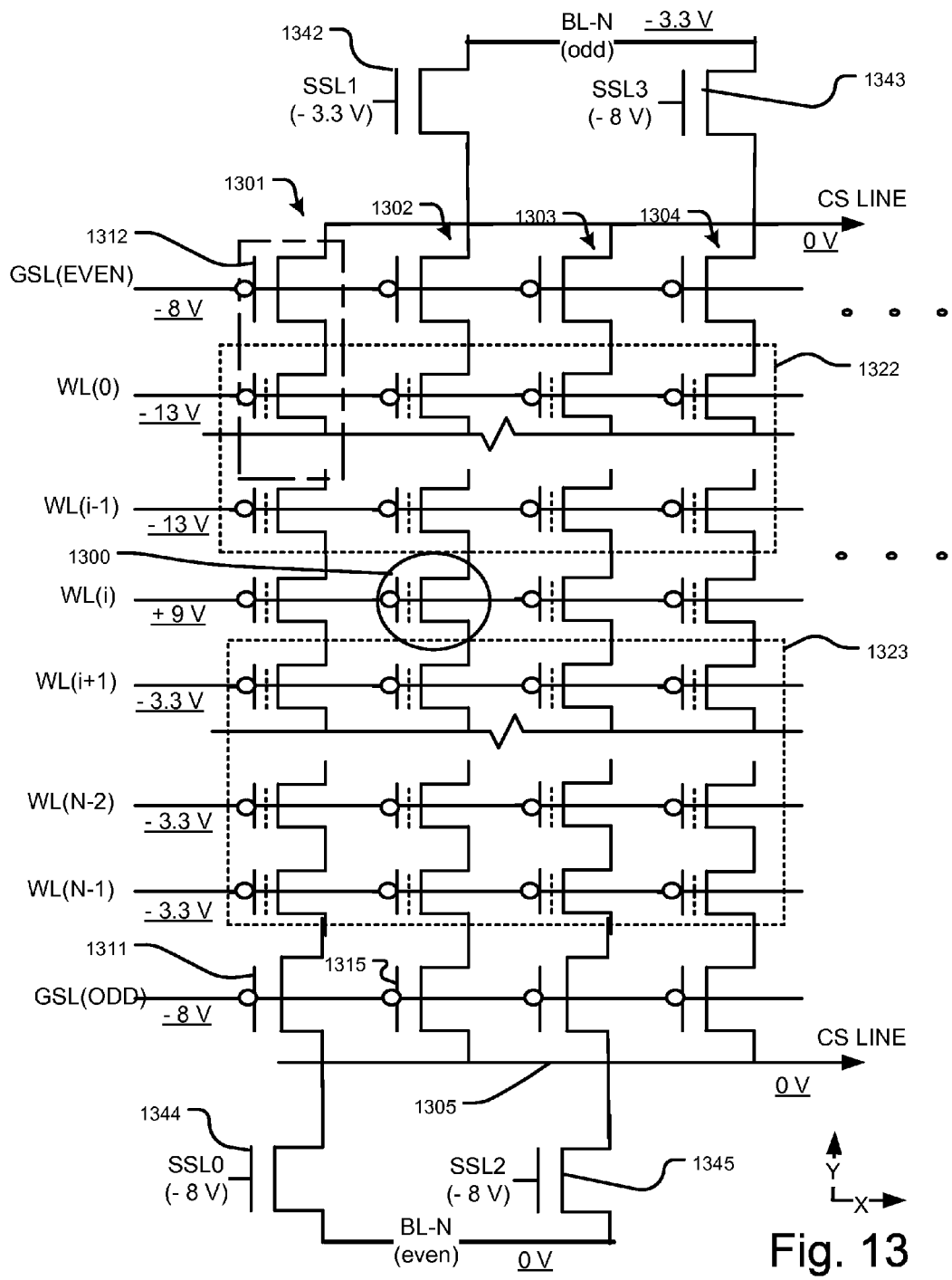
FIG. 13 is a schematic diagram of a level of a split page, p-channel 3D NAND structure showing a bias arrangement for a program operation.

FIG. 13 is a circuit diagram showing a multi-page plane (X-Y plane) in a 3D NAND array, in which there are four p-channel NAND strings 1301, 1302, 1303, 1304 including p-channel memory cells (e.g. 1313). The illustrated strings 1301, 1302, 1303, 1304 can be disposed on the same level of the 3D array like that of FIG. 5, sharing even and odd GSL lines for the even and odd pages, and having separate SSL lines coupled to respective even and odd global bit lines BL-N(even) and BL-N(odd) for example via a stair step contact structure on opposing ends of the block like that shown in FIG. 5, and to even and odd common source CS lines 1305. The strings are connected to the corresponding global bit lines BL-1 to BL-4 by respective p-channel string select transistors (1342, 1343, 1344, 1345). The strings are connected to the even or odd common source line for the plane by respective p-channel ground select transistors (e.g. 1311, 1312).

A biasing arrangement for programming the selected memory cell 1300 is illustrated in FIG. 13. The selected memory cell 1300 is disposed in the NAND string 1302 and connected by the SSL transistor 1342 to the bit line BL-N (odd). The signal SSL1 connected to the SSL transistor 1342 is bias at −3.3 V, while the selected bit line is biased at about the same level which tends to isolate the drain side of the string from the bit line. The signal GSL (odd) connected to the GSL transistor 1315 is biased at about −8 V which tends to connect the source side of the string to the common source CS line, which is biased at about 0 V. Drain side pass voltages are applied to the word lines WL(0) to WL(i−1) having a magnitude of about −13 V in this example. Source side pass voltages of about −3.3 V (near −Vcc) are applied to the source side word lines WL (i+1) through WL (N−1). The selected word line WL(i) receives a program voltage of about +9 V in this example. This bias level will isolate the drain side (region 1322) from the source side (region 1323) of the semiconductor string. At the time the pass voltage pulses are applied to the drain side word lines, the drain side of the semiconductor body for the semiconductor string 1302 is boosted to relatively high negative voltage, while the source side is coupled to about 0 V. As a result, the selected memory cell 1300 is biased for band to band tunneling, hot electron injection programming.

The unselected strings coupled to the SSL transistors 1343, 1344, 1345 are biased to inhibit disturbance of the charge stored in the memory cells. For the string 1304 which is connected to the SSL transistor 1343 and arranged for connection to the selected bit line BL-N (odd), the SSL3 signal is set at about −8 V sufficient to couple the voltage −3.3 V from the bit line BL-N (odd) to the string 1304. This tends to bias the drain side of the string 1304 to the voltage −3.3 V, which is insufficient to set up significant tunneling current in the cell coupled to the selected word line WL (i). For the strings 1301 and 1303 having SSL transistors 1344, 1345 connecting the strings to the unselected bit line BL-N (even), the signals SSL0 and SSL2 on the gates are set at about −8 V, tending to couple the transistors on the source side region 1323 to the 0 V applied to the unselected bit lines. Also, the even and odd GSL lines coupled to the GSL transistors (e.g. 1311, 1312) receive a bias of about −8 V, coupling the drain side (drain side of selected cell) region 1322 to the 0 V of the common source line. This tends to prevent formation of a band-to-band tunneling condition in the unselected memory cells coupled to the selected word line WL (i).

The program biasing arrangement illustrated in FIG. 13 can be extended to structures having many pages. The particular voltages illustrated in the figure are representative, and may very across reasonable ranges that achieve the desired effect.

Figure 14:
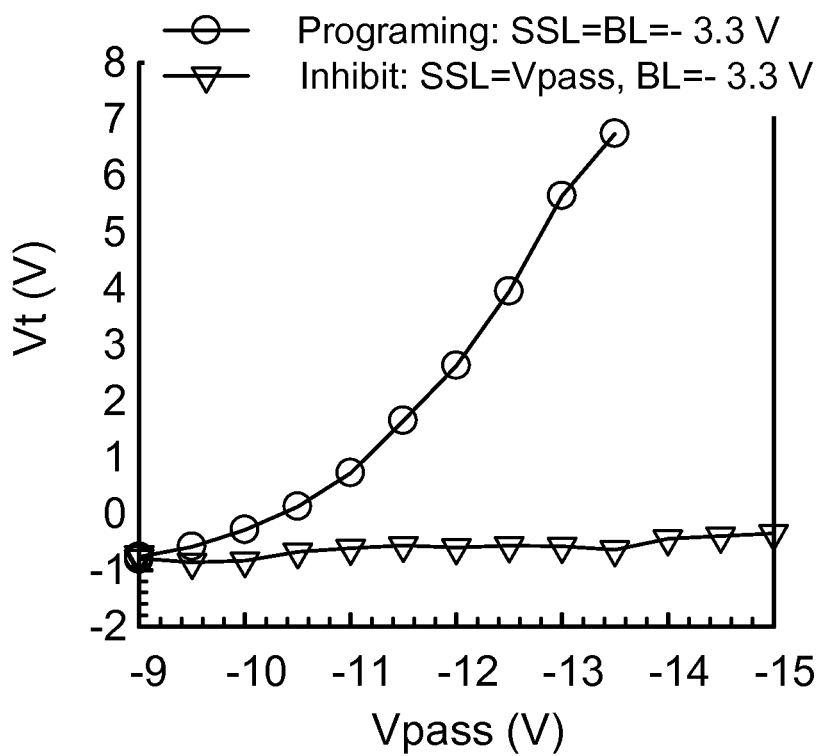
FIG. 14 is a graph illustrating program performance for split page p-channel 3D NAND structure.

FIG. 14 is a graph showing threshold voltage versus pass voltage for the multipage embodiment shown in FIG. 13. As shown, the memory cells having a low threshold on unselected pages do not suffer substantial disturbance as a result of programming on an adjacent page. In the illustration, the signal applied to the SSL transistor for the unselected page is equal to the drain side pass voltage, which is enough higher than the bias on the bit line at −3.3 V to ensure that the string is connected to the bit line to avoid boosting during the application of the pass voltages.

Figure 15:
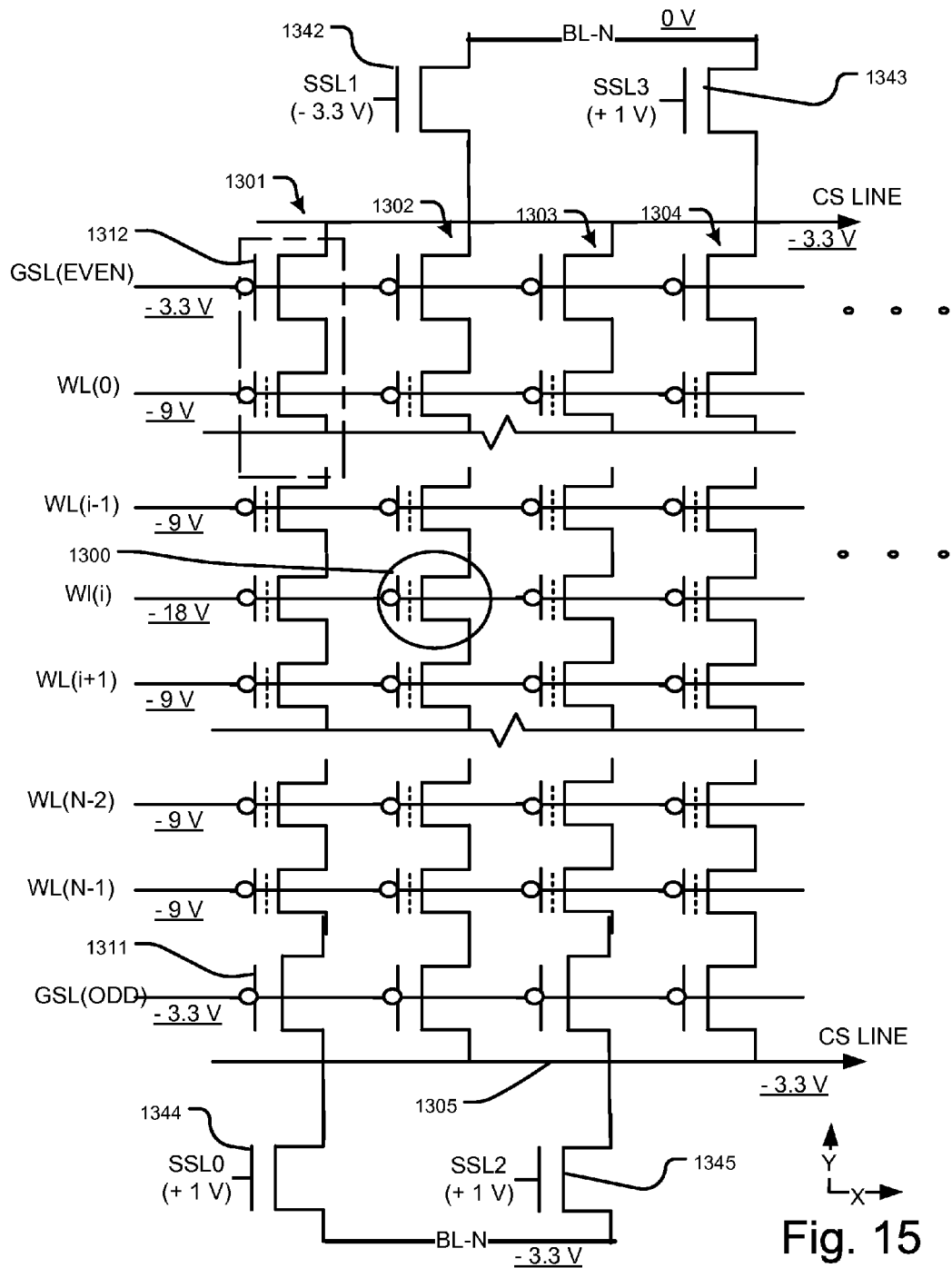
FIG. 15 is a schematic diagram of a level of a split page, p-channel 3D NAND structure showing a bias arrangement for an erase operation.

FIG. 15 illustrates the circuit shown in FIG. 13, with a bias arrangement for an erase operation. In the illustrated example, the page corresponding to string 1302 is biased for erase of the selected memory cell 1300. The selected bit line BL-N (odd) is coupled to about 0 V, while the signal SSL1, which is coupled to the SSL transistor for the selected page is coupled to about −3.3 V. This couples the semiconductor bodies of the cells in the string to the voltage (0 V) on the selected bit line. The unselected bit lines receive a bias of about −3.3 V. The signals SSL0, SSL2 and SSL3 on unselected pages are coupled to about +1 V. This turns off the SSL transistors, the coupling the corresponding pages from the selected bit line and from the unselected bit lines. The GSL (even) and the GSL (odd) signals are also set at about −3.3 V.

The common source lines are likewise coupled to about −3.3 V. This results in isolating the selected memory cell 1300 for −FN tunneling. Unselected pages are self-boosted because the SSL transistors are turned off, upon application of the pass voltages and erase voltage, inhibiting disturbance of the memory cells in the unselected pages.

Figure 16:
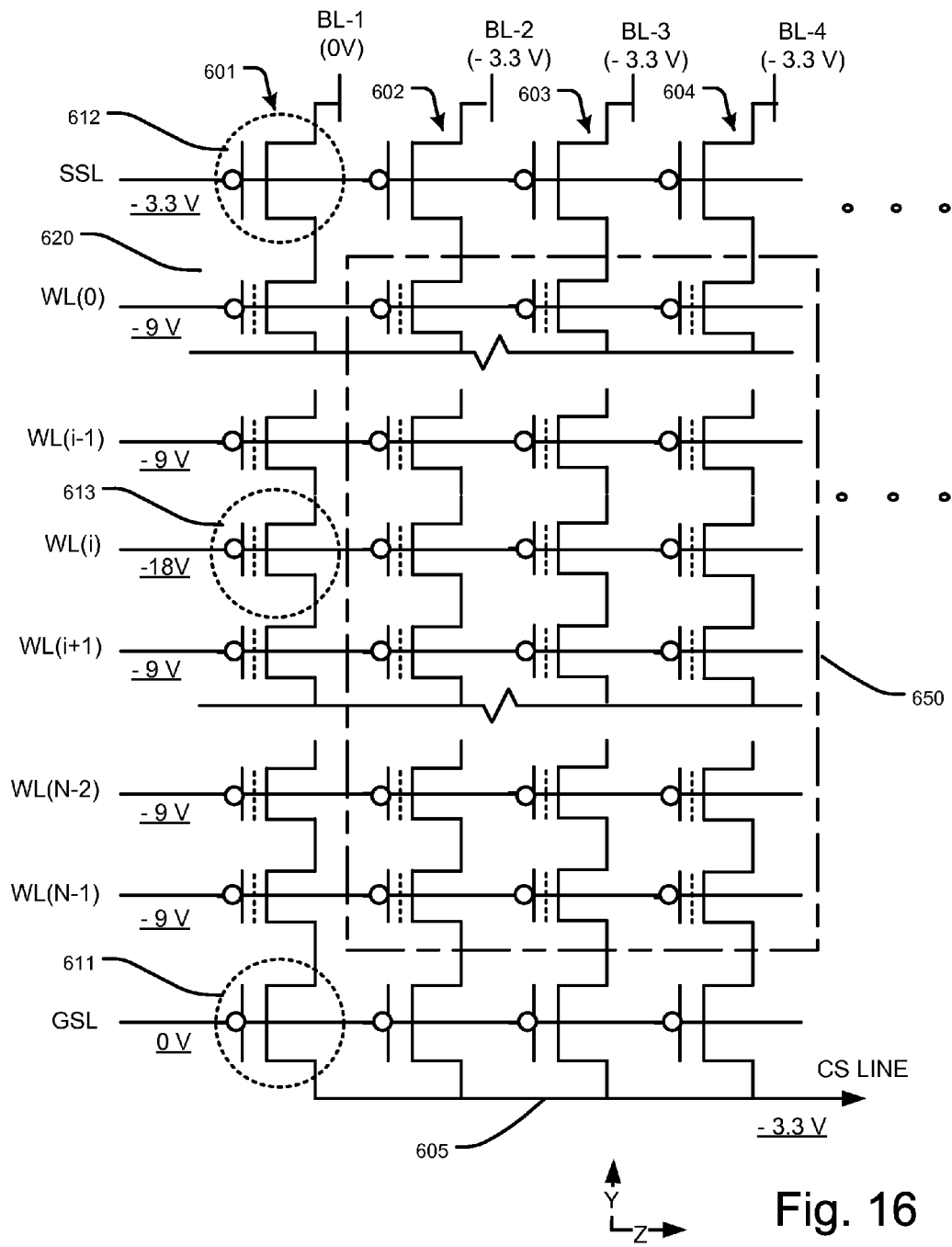
FIG. 16 is a schematic diagram of a slice of a p-channel 3D NAND structure showing a bias arrangement for a bit erase operation.

FIG. 16 illustrates the circuit of FIG. 6A for a slice of a 3D array like that of FIG. 5, with a bias arrangement for erasing a selected memory cell 113. The biasing arrangement for selective erase, or bit erase, includes applying about 0 V to the selected bit line BL-1, and about −3.3 V to the common source line. The unselected bit lines BL-2, BL-3, BL-4 also receive about −3.3 V. The SSL line applied to the SSL transistors (e.g. 112) receives about −3.3 V and the GSL line applied to the GSL transistors (e.g. 111) receives about 0 V. As a result of this biasing arrangement, the semiconductor string 101 has its body coupled to the selected bit line voltage of about 0 V, while the other semiconductor strings in the region 650 are isolated from their bit lines and from the common source line. As a result, when the erase voltage is applied to the selected word line WL (i), and pass voltages are applied to the unselected word lines (all word lines except WL(i)), the unselected strings are capacitively boosted to avoid formation of an FN tunneling field, while the tunneling field is developed at the selected memory cell 113. The pass voltage levels are set at a level that is insufficient to cause significant disturbance of the charge stored in unselected memory cells on the selected string, while enabling a transfer of the voltage from the selected bit line through the string.

Figure 17:
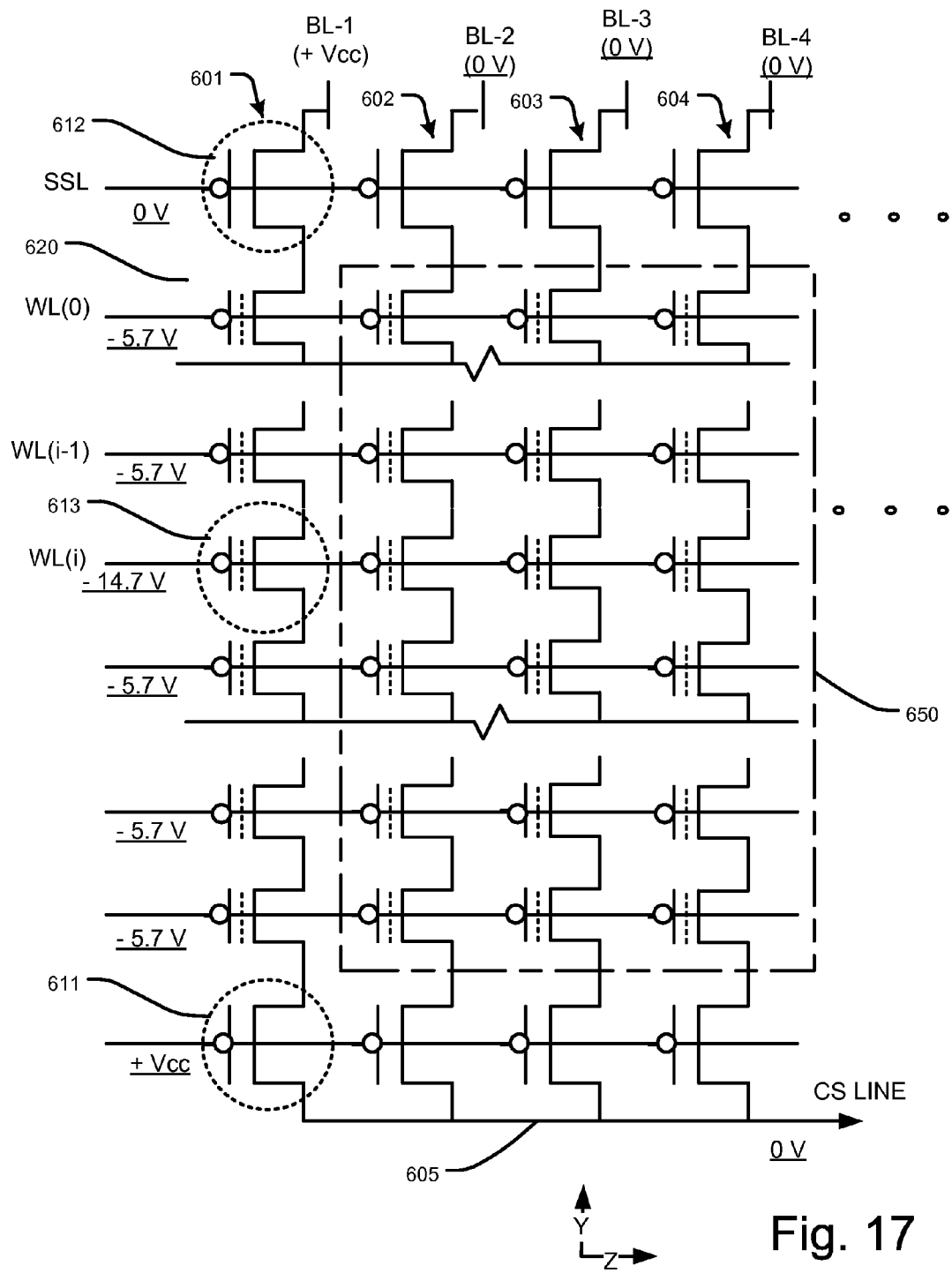
FIG. 17 is a schematic diagram of a slice of a p-channel 3D NAND structure showing a bias arrangement for a bit erase operation with divided voltages.

FIG. 17 illustrates a bit selective erase bias arrangement like that of FIG. 16, with divided voltages. In this example, the divided voltages are set by shifting each of the voltages of FIG. 16 upward by about +Vcc. This enables the use of non-negative voltages on the bit lines, that can simplify implementation of page buffers and other structures needed to deliver the voltages for operating the memory. Thus, the biasing arrangement for divided voltage bit erase, includes applying about +Vcc to the selected bit line BL-1, and about 0 V to the common source line. The unselected bit lines BL-2, BL-3, BL-4 also receive about 0 V. The SSL line applied to the SSL transistors (e.g. 112) receives about 0 V and the GSL line applied to the GSL transistors (e.g. 111) receives about +Vcc. As a result of this biasing arrangement, the semiconductor string 101 has its body coupled to the selected bit line voltage of about +Vcc, while the other semiconductor strings in the region 650 are isolated from their bit lines and from the common source line. As a result, when the erase voltage is applied to the selected word line WL (i), and pass voltages are applied to the unselected word lines (all word lines except WL(i)), the unselected strings are capacitively boosted to avoid formation of an FN tunneling field, while the tunneling field is developed at the selected memory cell 113. The pass voltage levels are set at a level that is insufficient to cause significant disturbance of the charge stored in unselected memory cells on the selected string, while enabling a transfer of the voltage from the selected bit line through the string.

Figure 18:
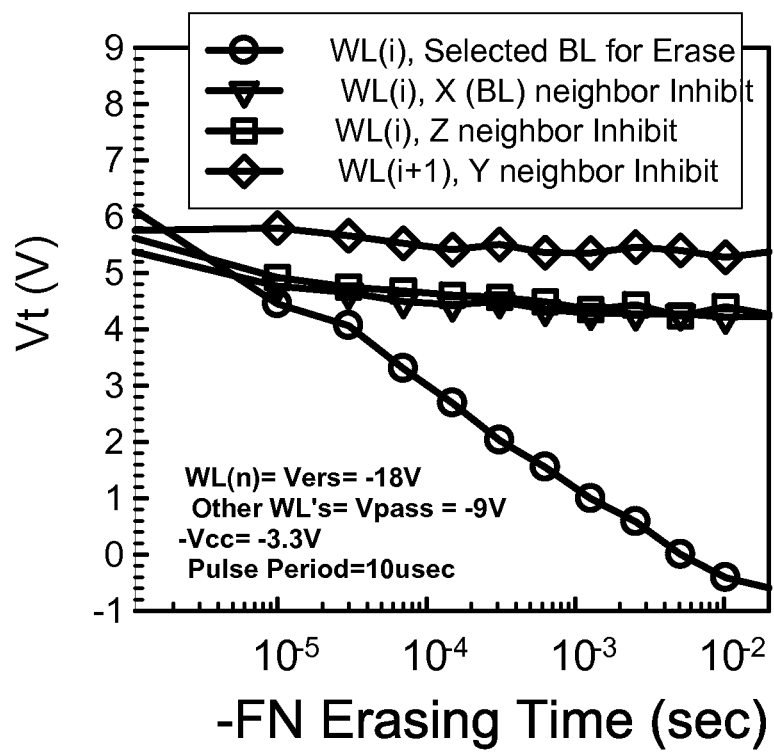
FIG. 18 is a graph illustrating bit erase performance for p-channel 3D NAND structure.

FIG. 18 is a graph of threshold voltage versus time to illustrate erase inhibit performance for the bias arrangement of FIG. 16 using a 10 μs program and pass voltage pulse length. The graph shows that the drop in threshold voltage for the selected memory cell on the selected word line WL (i) can occur without significant disturbance of neighboring cells. The other traces show that neighboring high threshold cells are minimally disturbed. The neighbor cells include cells on the selected word line in the same plane or level of the block, and are thereby coupled to the same bit line (X neighbor inhibit) cells on the same word line and the same slice, but an adjacent different level (Z neighbor inhibit), and cells on an adjacent word line in the same string (Y neighbor inhibit).

A 3D NAND memory device is described therefore which supports block erase, bit program and bit erase operations. For example, the following table shows an operating sequence usable as described herein. The first pair of columns show the data after block erase of memory cells connected to five word lines (WL(i+2), WL(i+1), WL(i), WL(i−1), WL(i−2)) and adjacent bit lines (BL(m), BL(m+1)). The second pair of columns shows the data after bit programming using band-to-band tunneling hot electron injection as described for the same memory cells. The third pair of columns shows the data after bit erase using the bit erase biasing operations described herein for the same memory cells.

|          | BLOCK ERASE | | BBHE PGM | | BIT ERASE | |
|----------|---|---|---|---|---|---|
| WL (i + 2) | 1 | 1 | 0 | 0 | 0 | 1 |
| WL (i + 1) | 1 | 1 | 0 | 1 | 0 | 1 |
| WL (i)     | 1 | 1 | 1 | 0 | 1 | 0 |
| WL (i − 1) | 1 | 1 | 0 | 1 | 1 | 1 |
| WL (i − 2) | 1 | 1 | 0 | 0 | 1 | 0 |

Thus, a block erase operation can be applied to set all of the memory cells to a logical "1" value. A bit programming operation can be applied in a first sequence to the bit line BL(m) to set the memory cells on word lines WL(i+2), WL(i+1) and WL(i−1) to a logical "0" value, and in a second sequence to the bit line BL (m+1) to set the memory cells on word lines WL(i+2), WL(i) and WL(i−2) to a logical "0" value. Next, a bit erase operation can be applied in a first sequence to set the memory cell on word line WL(i−1) and bit line BL(m) to a logical "1", and in a second sequence to set the memory cell on the word line WL(i+2) and the bit line BL(m+1) to a logical "1". Testing has illustrated that the bit erase operations are feasible, maintaining a successful sensing window in spite of program and erase disturb. Also, typical drain current to gate voltage curves are maintained over a checkerboard programming operation.

Figure 19:
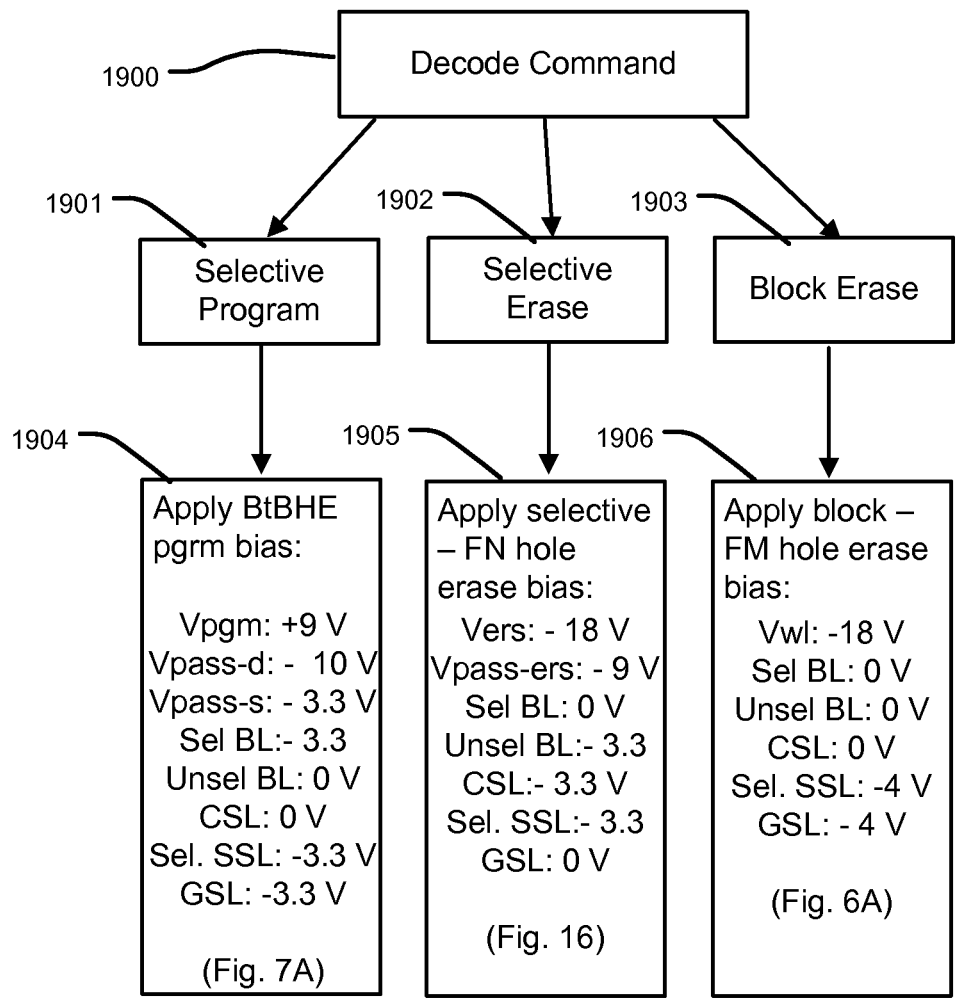
FIG. 19 is a flow chart illustrating operation of a p-channel 3D NAND.

FIG. 19 illustrates operations executed by control circuitry in an integrated circuit including control logic and bias and voltage supply circuits, such as that illustrated in FIG. 1. In block 1900, the control circuitry decodes an incoming command. The command can be one of a selective program 1901, selective erase 1902, and block erase 1903 in embodiments of the technology described herein. If a selective program command is received, then a program bias arrangement to induce band-to-band tunneling hot electron injection is applied, such as that illustrated in FIG. 7A and shown in block 1904. In alternatives, divided voltage arrangements can be applied as well in which only non-negative voltages are applied to a bit line. If a selective erase command is received, then a selective erase bias arrangement is applied that induces −FN hole tunneling in selected cells, such as that illustrated in FIG. 16, and shown in block 1905. In alternatives, divided voltage arrangements can be applied as well, in which only non-negative voltages are applied to bit lines. If a block erase command is received, then a block erase bias arrangement is applied that induces −FN hole tunneling to a selected block, such as that illustrated in FIG. 6A, as shown in block 1906. In alternatives, divided voltage arrangements can be applied as well, reducing the absolute magnitude of negative voltages required on the chip.

3D NAND memory devices are described using a p-channel configuration which can be implemented in a junction-free embodiment. In a junction-free embodiment, there is no high doping p-type concentration diffusion region in the string. Rather, it can be implemented with an n-type strip of semiconductor material. P+ diffusion regions can be implemented in the strings only outside at the string select transistors. As a result, excellent short-channel device performance is achieved. Relatively long channel lengths can be implemented for the string select transistors to avoid thermal diffusion of p+ doping into the memory cell string.

The band-to-band tunneling induced hot electron injection technique is applied for programming for p-channel NAND strings. Local self-boosting can be used to enhance the virtual drain bias on the string for efficient implementation.

A block erase operation is described in which all of the word lines for a given block can be applied a relatively large negative voltage to induce hole current for erasing the memory cells in the block.

Also, a selected memory cell erase operation (bit erase) based on −FN tunneling is described, where only a selected word line receives a negative voltage sufficient to induce tunneling, while other word lines in the block received a pass voltage level. Utilizing a selected memory cell erase operation, a simple override of small units of memory cells can be implemented to avoid block erase operations for some types of memory utilization.

Implementations are described using divided voltages which can simplify the peripheral circuitry implementation, avoiding for example the requirement for page buffers capable of handling negative bit line voltages.

Utilizing the technology described herein, a 3D NAND device is provided that can have maximum voltages within the range of + or −15 V, allowing smaller design rules (sizes) for implementation of peripheral CMOS devices.

The architectures described herein for 3D NAND are well-suited for the operating methods described. However, the operating method can also be applied to other types of 3D NAND structures, including p-channel "BiCS," "TCAT" and others. For a description of BiCS structures, see, R. Katsumata, et al., "Pipe-shaped BiCS Flash Memory with 16 Stacked Layers and Multi-Level-Cell Operation for Ultra High Density Storage Devices," Symposium on VLSI Technology, pp. 136-137, 2009, which is incorporated by reference as if fully set forth herein. For a description of TCAT structures, see, J. Jang, et al., "Vertical Cell Array using TCAT (Terabit Cell Array Transistor) Technology for Ultra High Density NAND Flash Memory," Symposium on VLSI Technology, pp. 192-193, 2009, which is incorporated by reference as if fully set forth herein. Changing the n-channel implementations contemplated by these references to p-channel enables the utilization of the operating technologies described herein.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for operating a 3D, p-channel flash memory, comprising:
   programming selected memory cells in the 3D, p-channel flash memory using band-to-band tunneling hot electron injection;
   erasing selected blocks of cells using Fowler-Nordheim FN hole tunneling; and inhibiting erasing in unselected memory cells by local self-boosting.

2. The method of claim 1, wherein said programming includes applying a positive program voltage to word lines of selected memory cells, and applying negative pass voltages to word lines of unselected memory cells.

3. The method of claim 1, wherein said programming includes applying a positive program voltage to word lines of selected memory cells, and applying a negative drain side pass voltage to word lines of unselected memory cells on one side (drain side) of the selected memory cell, and a negative source side pass voltage to word lines of unselected memory cells on another side (source side) of the selected memory cell.

4. The method of claim 2, wherein the positive program voltage has an absolute value magnitude less than 15V.

5. The method of claim 2, including applying a non-negative voltage to bit lines of unselected memory cells.

6. A method for operating a p-channel, dual gate flash memory, comprising:
erasing selected memory cells in the p-channel, dual gate flash memory using negative Fowler-Nordheim tunneling of holes.

7. A method for inducing hot electron injection in a selected memory cell in a p-channel NAND string in a NAND array, comprising:
applying a program bias arrangement to program a selected memory cell, the program bias arrangement including:
a positive program voltage pulse on a word line coupled with a selected memory cell, blocking flow of carriers between a first semiconductor body region on a first side of the selected memory cell and a second semiconductor body region on a second side of the selected memory cell;
a negative drain side pass voltage pulse on word lines in the plurality of word lines on the first side of the selected memory cell;
a negative source side pass voltage on word lines in the plurality of word lines on the second side of the selected memory cell;
bias voltages to block current flow between a selected bit line and the semiconductor body region on the first side of the selected memory cell during the negative drain side pass voltage pulse thereby causing capacitive boosting of the first semiconductor region to a boosted, negative voltage level, and to allow current flow between a source line and the semiconductor body region on the second side of the selected memory cell thereby coupling the semiconductor body on the second side of the selected memory cell to the source line; and
bias voltages to prevent capacitive boosting in unselected NAND strings during the negative drain side pass voltage pulse.

8. The method of claim 7, wherein NAND strings in the NAND array include a first switch between a first end of the NAND string and a bit line or reference line and a second switch between a second end of the NAND string and a bit line or reference line, and wherein:
the bias voltages to block current flow between a selected bit line and the semiconductor body region on the first side of the selected memory cell include voltages which turn off the first switch in the NAND string including the selected memory cell; and
the bias voltages to allow current flow between the source line and the semiconductor body region on the second side of the selected cells include voltages which turn on the second switch and apply a reference voltage to the source line.

9. A method for inducing hot electron injection in a selected memory cell in a p-channel NAND string in a NAND array, comprising:
applying a program bias arrangement to program a selected memory cell, the program bias arrangement including:
a positive program voltage pulse on a word line coupled with a selected memory cell, blocking flow of carriers between a first semiconductor body region on a first side of the selected memory cell and a second semiconductor body region on a second side of the selected memory cell;
a negative drain side pass voltage pulse on word lines in the plurality of word lines on the first side of the selected memory cell;
a negative source side pass voltage on word lines in the plurality of word lines on the second side of the selected memory cell; and
bias voltages to block current flow between a selected bit line and the semiconductor body region on the first side of the selected memory cell during the negative drain side pass voltage pulse thereby causing capacitive boosting of the first semiconductor region to a boosted, negative voltage level, and to allow current flow between a source line and the semiconductor body region on the second side of the selected memory cell thereby coupling the semiconductor body on the second side of the selected memory cell to the source line, wherein the NAND array comprises a 3D array.

10. A memory comprising:
a 3D NAND array including a plurality of NAND strings, a NAND string in the array including a plurality of p-channel memory cells arranged in series in an n-type or intrinsic semiconductor body;
a plurality of word lines, word lines in the plurality coupled to corresponding memory cells in the plurality of memory cells; and
control circuitry coupled to the plurality of word lines adapted for programming a selected memory cell in the plurality of memory cells corresponding to a selected word line using a program bias arrangement that induces band-to-band tunneling hot electron injection.

11. The memory of claim 10, wherein the program bias arrangement includes:
a positive program voltage pulse on a word line coupled with a selected memory cell, blocking flow of carriers between a first semiconductor body region on a first side of the selected memory cell and a second semiconductor body region on a second side of the selected memory cell;
a negative drain side pass voltage pulse on word lines in the plurality of word lines on the first side of the selected memory cell;
a negative source side pass voltage on word lines in the plurality of word lines on the second side of the selected memory cell; and
bias voltages to block current flow between a selected bit line and the semiconductor body region on the first side of the selected memory cell during the negative drain side pass voltage pulse thereby causing capacitive boosting of the first semiconductor region to a boosted, negative voltage level, and to allow current flow between a source line and the semiconductor body region on the second side of the selected memory cell thereby coupling the semiconductor body on the second side of the selected memory cell to the source line.

12. The memory of claim 10, wherein the control circuitry is adapted for erasing a selected memory cell in the plurality of memory cells using a selective erase bias arrangement.

13. The memory of claim 12, wherein the selective erase bias arrangement includes:
   a negative erase voltage pulse on a word line coupled with a selected memory cell;
   a negative drain side voltage pulse on unselected word lines in the plurality of word lines, the negative drain side pass voltage having an absolute magnitude less than the negative erase voltage pulse;
   bias voltages to allow current flow between a selected bit line and the NAND string including the selected memory cell during the negative erase voltage pulse, and to allow current flow between a source line and the NAND string including the selected memory cell; and
   bias voltages to block current flow between unselected bit lines and NAND strings not including the selected memory cell during the negative erase voltage pulse, and to block current flow between a source line and NAND strings not including the selected memory cell during the negative erase voltage pulse.

14. The memory of claim 10, wherein the control circuitry is adapted for a block erase by a block erase bias arrangement to induce −FN hole tunneling.

15. The memory of claim 10, wherein the memory cells comprise dual gate, thin film flash memory cells.

16. A memory comprising:
   a 3D NAND array including a plurality of NAND strings, a NAND string in the array including a plurality of p-channel memory cells arranged in series in an n-type or intrinsic semiconductor body;
   a plurality of word lines, word lines in the plurality coupled to corresponding memory cells in the plurality of memory cells; and
   control circuitry coupled to the plurality of word lines adapted for selectively erasing a selected memory cell in the plurality of memory cells using a selective erase bias arrangement to reduce a threshold in the selected memory cell.

17. The memory of claim 16, wherein the selective erase bias arrangement includes:
   a negative erase voltage pulse on a word line coupled with a selected memory cell;
   a negative drain side voltage pulse on unselected word lines in the plurality of word lines, the negative drain side pass voltage having an absolute magnitude less than the negative erase voltage pulse;
   bias voltages to allow current flow between a selected bit line and the NAND string including the selected memory cell during the negative erase voltage pulse, and to allow current flow between a source line and the NAND string including the selected memory cell; and
   bias voltages to block current flow between unselected bit lines and NAND strings not including the selected memory cell during the negative erase voltage pulse, and to block current flow between a source line and NAND strings not including the selected memory cell during the negative erase voltage pulse.

18. The memory of claim 16, wherein the selective erase bias arrangement induces —FN hole tunneling in the selected cell.

19. The memory of claim 16, wherein the control circuitry is adapted for selectively programming a selected memory cell in the plurality of memory cells using a program bias arrangement to increase a threshold in the selected memory cell.

20. The memory of claim 19, wherein the program bias arrangement induces band-to-band tunneling current hot electron injection.

21. A memory comprising:
   a NAND string including a plurality of p-channel dual gate flash memory cells in an n-type or intrinsic semiconductor body; and
   control circuitry adapted for selectively erasing a selected memory cell in the plurality of memory cells using a selective erase bias arrangement, and for selectively programming a selected memory cell in the plurality of memory cells using a selective program bias arrangement.

* * * * *